United States Patent [19]

Bell

[11] Patent Number: 5,706,402
[45] Date of Patent: Jan. 6, 1998

[54] BLIND SIGNAL PROCESSING SYSTEM EMPLOYING INFORMATION MAXIMIZATION TO RECOVER UNKNOWN SIGNALS THROUGH UNSUPERVISED MINIMIZATION OF OUTPUT REDUNDANCY

[75] Inventor: Anthony J. Bell, San Diego, Calif.

[73] Assignee: The Salk Institute for Biological Studies, La Jolla, Calif.

[21] Appl. No.: 346,535

[22] Filed: Nov. 29, 1994

[51] Int. Cl.$^6$ .................................................... G06F 15/31
[52] U.S. Cl. .................................................... 395/23; 395/20
[58] Field of Search ............................................. 395/23, 20

[56] References Cited

U.S. PATENT DOCUMENTS

| | | | |
|---|---|---|---|
| 4,965,732 | 10/1990 | Roy, III et al. | 364/460 |
| 5,272,656 | 12/1993 | Genereux | 395/27 |
| 5,383,164 | 1/1995 | Sejnowski et al. | 67/134 |
| 5,539,832 | 7/1996 | Weinstein et al. | 381/94 |

OTHER PUBLICATIONS

Sklar, Bernard, *Digital Communications*; 1988 PTR Prentice-Hall, Inc., Englewood Cliffs, NJ 07632 Section 2.11 Intersymbol Interference, pp. 105 and 106.

Joseph J. Atick, "Could information theory provide an ecological theory of sensory processing?", *Network* 3 (1992), pp. 213–251.

H. B. Barlow, "Unsupervised Learning", *Neural Computation* 1 (1989), pp. 295–311.

H. B. Barlow et al., "Adaption and Decorrelation in the Cortex", *The Computing Neuron*, pp. 54–72.

Suzanna Becker et al., "Self-organizing neural network that discovers surfaces in random-dot stereograms", *Nature*, vol. 355 (Jan. 9, 1992), pp. 161–163.

Gilles Burel, "Blind Separation of Sources: A Nonlinear Neural Algorithm", *Neural Networks*, vol. 5 (1992), pp. 937–947.

P. Comon et al., "Blind separation of sources, Part II: Problems statement", *Signal Processing* 24 (1991), pp. 11–20.

Pierre Comon, "Independent component analysis, A new concept?", *Signal Processing* 36 (1994), pp. 287–314.

D. Hatzinakos et al., "Ch. 5, Blind Equalization Based On Higher–Order Statistics (H.O.S.)", *Blind Deconvolution*, pp. 181–258.

Simon Haykin, "Ch. 20, Blind Deconvolution", *Adaptive Filter Theory, Second Edition*, Prentice Hall (1991), pp. 722–756.

Simon Haykin, "Ch. 1, The Blind Deconvolution Problem", *Blind Deconvolution*, (ed.) Prentice Hall (1994), pp. 1–7.

Sandro Bellini, "Ch. 2, Bussgang Techniques for Blind Deconvolution and Equalization", *Blind Deconvolution*, S. Haykin (ed.) Prentice Hall (1994), pp. 8–57.

Simon Haykin, "Ch. 11, Self–Organizing Systems III: Information–Theoretic Models", *Neural Networks: A Comprehensive Foundation*, S. Haykin (ed.) MacMillan (1994), pp. 444–472.

(List continued on next page.)

*Primary Examiner*—George B. Davis
*Attorney, Agent, or Firm*—Baker, Maxham, Jester & Meador

[57] ABSTRACT

A neural network system and unsupervised learning process for separating unknown source signals from their received mixtures by solving the Independent Components Analysis (ICA) problem. The unsupervised learning procedure solves the general blind signal processing problem by maximizing joint output entropy through gradient ascent to minimize mutual information in the outputs. The neural network system can separate a multiplicity of unknown source signals from measured mixture signals where the mixture characteristics and the original source signals are both unknown. The system can be easily adapted to solve the related blind deconvolution problem that extracts an unknown source signal from the output of an unknown reverberating channel.

15 Claims, 8 Drawing Sheets

OTHER PUBLICATIONS

J. J. Hopfield, "Olfactory computation and object perception", *Proc. Natl. Acad. USA*, vol. 88 (Aug. 1991), pp. 6462–6466.

C. Jutten and J. Herault, "Blind separation of sources, Part I: An adaptive algorithm based on neuromimetic architecture", *Signal Processing* 24 (1991), pp. 1–10.

S. Laughlin "A Simple Coding Procedure Enhances a Neuron's Information Capacity", *Z. Naturforsch* 36 (1981), pp. 910–912.

Ralph Linsker, "An Application of the Principles of Maximum Information Preservation to Linear Systems", *Advances in Neural Information Processing Systems* 1, pp. 186–194.

Ralph Linsker, "Local Synaptic Learning Rules Suffice to Maximize Mutual Information in a Linear Network", *Neural Computation* 4 (1992), pp. 691–702.

L. Molgedey and H. G. Schuster, "Separation of a Mixture of Independent Signals Using Time Delayed Correlations", *Physical Review Letters*, vol. 72, No. 23, (Jun. 6, 1994), pp. 3634–3637.

John C. Platt, "Networks for the Separation of Sources that are Superimposed and Delayed", *Advances in Neural Information Processing Systems* 4, Morgan–Kaufmann (1992), pp. 730–737.

N. Schraudolph et al., "Competitive Anti–Hebbian Learning of Invariants", *Advances in Neural Processing Information Systems* 4, pp. 1017–1024.

E. Sorouchyari, "Blind separation of sources, Part III: Stability analysis", *Signal Processing* 24 (1991), pp. 21–29.

D. Yellin et al., "Criteria for Multichannel Signal Separation", *IEEE Transaction on Signal Processing*, vol. 42, No. 8, (Aug. 1994), pp. 2158–2168.

J. Maddox, "Cocktail party effect made tolerable", *Nature*, vol. 369 (Jun. 16, 1994), p. 517.

FREQ (Hz)

FREQ (Hz)

| TASK | WHITENING | BARREL EFFECT | MANY ECHOES |
|---|---|---|---|
| NO. OF TAPS | 15 | 25 | 30 |
| TAP SPACING | 1 (= 0.125ms) | 10 (= 1.25ms) | 100 (= 12.5ms) |
| CONVOLVING FILTER [A] | FIG. 11A | FIG. 11E | FIG. 11I |
| IDEAL DECONVOLVING FILTER [$W_{IDEAL}$] | FIG. 11B | FIG. 11F | FIG. 11J |
| LEARNT DECONVOLVING FILTER [W] | FIG. 11C | FIG. 11G | FIG. 11K |
| [W]*[A] | FIG. 11D | FIG. 11H | FIG. 11L |

BLIND SIGNAL PROCESSING SYSTEM EMPLOYING INFORMATION MAXIMIZATION TO RECOVER UNKNOWN SIGNALS THROUGH UNSUPERVISED MINIMIZATION OF OUTPUT REDUNDANCY

REFERENCE TO GOVERNMENT RIGHTS

The U. S. Government has rights in the invention disclosed and claimed herein pursuant to Office of Naval Research grant no. N00014-93-1-0631.

BACKGROUND OF THE INVENTION

1. Field of the Invention

This invention relates generally to systems for recovering the original unknown signals subjected to transfer through an unknown multichannel system by processing the known output signals therefrom and relates specifically to an information-maximizing neural network that uses unsupervised learning to recover each of a multiplicity of unknown source signals in a multichannel having reverberation.

2. Description of the Related Art

Blind Signal Processing: In many signal processing applications, the sample signals provided by the sensors are mixtures of many unknown sources. The "separation of sources" problem is to extract the original unknown signals from these known mixtures. Generally, the signal sources as well as their mixture characteristics are unknown. Without knowledge of the signal sources other than the general statistical assumption of source independence, this signal processing problem is known in the art as the "blind source separation problem". The separation is "blind" because nothing is known about the statistics of the independent source signals and nothing is known about the mixing process.

The blind separation problem is encountered in many familiar forms. For instance, the well-known "cocktail party" problem refers to a situation where the unknown (source) signals are sounds generated in a room and the known (sensor) signals are the outputs of several microphones. Each of the source signals is delayed and attenuated in some (time varying) manner during transmission from source to microphone, where it is then mixed with other independently delayed and attenuated source signals, including multipath versions of itself (reverberation), which are delayed versions arriving from different directions.

This signal processing problem arises in many contexts other than the simple situation where each of two unknown mixtures of two speaking voices reaches one of two microphones. Other examples involving many sources and many receivers include the separation of radio or radar signals sensed by an array of antennas, the separation of odors in a mixture by a sensor array, the parsing of the environment into separate objects by our biological visual system, and the separation of biomagnetic sources by a superconducting quantum interference device (SQUID) array in magnetoencephalography. Other important examples of the blind source separation problem include sonar array signal processing and signal decoding in cellular telecommunication systems.

The blind source separation problem is closely related to the more familiar "blind deconvolution" problem, where a single unknown source signal is extracted from a known mixed signal that includes many time-delayed versions of the source originating from unknown multipath distortion or reverberation (self-convolution). The need for blind deconvolution or "blind equalization" arises in a number of important areas such as data transmission, acoustic reverberation cancellation, seismic deconvolution and image restoration. For instance, high-speed data transmission over a telephone communication channel relies on the use of adaptive equalization, which can operate either in a traditional training mode that transmits a known training sequence to establish deconvolution parameters or in a blind mode.

The class of communication systems that may need blind equalization capability includes high-capacity line-of-site digital radio (cellular telecommunications). Such a channel suffers from anomalous propagation conditions arising from natural conditions, which can degrade digital radio performance by causing the transmitted signal to propagate along several paths of different electrical length (multipath fading). Severe multipath fading requires a blind equalization scheme to recover channel operation.

In reflection seismology, a reflection coefficient sequence can be blindly extracted from the received signal, which includes echoes produced at the different reflection points of the unknown geophysical model. The traditional linear-predictive seismic deconvolution method used to remove the source waveform from a seismogram ignores valuable phase information contained in the reflection seismogram. This limitation is overcome by using blind deconvolution to process the received signal by assuming only a general statistical geological reflection coefficient model.

Blind deconvolution can also be used to recover unknown images that are blurred by transmission through unknown systems.

Blind Separation Methods: Because of the fundamental importance of both the blind separation and blind deconvolution signal processing problems, practitioners have proposed several classes of methods for solving the problems. The blind separation problem was first addressed in 1986 by Jutten and Herault ("Blind separation of sources, Part I: An adaptive algorithm based on neuromimetic architecture", *Signal processing* 24 (1991) 1–10), who disclose the HJ neural network with backward connections that can usually solve the simple two-element blind source separation problem. Disadvantageously, the HJ network iterations may not converge to a proper solution in some cases, depending on the initial state and on the source statistics. When convergence is possible, the HJ network appears to converge in two stages, the first of which quickly decorrelates the two output signals and the second of which more slowly provides the statistical independence necessary to recover the two unknown sources. Comon et al. ("Blind separation of sources, Part II: Problems statement", *Signal Processing* 24 (1991) 11–20) show that the HJ network can be viewed as an adaptive process for cancelling higher-order cumulants in the output signals, thereby achieving some degree of statistical independence by minimizing higher-order statistics among the known sensor signals.

Other practitioners have attempted to improve the HJ network to remove some of the disadvantageous features. For instance, Sorouchyari ("Blind separation of sources, Part III: Stability analysis" *Signal Processing* 24 (1991) 21–29) examines other higher-order non-linear transforming functions other than those simple first and third order functions proposed by Jutten et al. but concludes that the higher-order functions cannot improve implementation of the HJ network. In U.S. Pat. No. 5,383,164, filed on Jun. 10, 1993 as application Ser. No. 08/074,940 and fully incorporated herein by this reference, Li et al. describe a blind source separation system based on the HJ neural network model that employs linear beamforming to improve HJ network separation performance. Also, John C. Platt et al. ("Networks For The Separation of Sources That Are Superimposed and Delayed", *Advances in Neural Information Processing Systems*, vol. 4, Morgan-Kaufmann, San Mateo, 1992) propose extending the original magnitude-optimizing HJ network to estimate a matrix of time delays in addition to the HJ magnitude mixing matrix. Platt et al. observe that their modified network is disadvantaged by multiple stable states and unpredictable convergence.

Pierre Comon ("Independent component analysis, a new concept?" *Signal Processing* 36 (1994) 287–314) provides a detailed discussion of Independent Component Analysis (ICA), which defines a class of closed form techniques useful for solving the blind identification and deconvolution problems. As is known in the art, ICA searches for a transformation matrix to minimize the statistical dependence among components of a random vector. This is distinguished from Principal Components Analysis (PCA), which searches for a transformation matrix to minimize statistical correlation among components of a random vector, a solution that is inadequate for the blind separation problem. Thus, PCA can be applied to minimize second order cross-moments among a vector of sensor signals while ICA can be applied to minimize sensor signal joint probabilities, which offers a solution to the blind separation problem. Comon suggests that although mutual information is an excellent measure of the contrast between joint probabilities, it is not practical because of computational complexity. Instead, Comon teaches the use of the fourth-order cumulant tensor (thereby ignoring fifth-order and higher statistics) as a preferred measure of contrast because the associated computational complexity increases only as the fifth power of the number of unknown signals.

Similarly, Gilles Burel ("Blind separation of sources: A nonlinear neural algorithm", *Neural Networks* 5 (1992) 937–947) asserts that the blind source separation problem is nothing more than the Independent Components Analysis (ICA) problem. However, Burel proposes an iterative scheme for ICA employing a back propagation neural network for blind source separation that handles non-linear mixtures through iterative minimization of a cost function. Burel's network differs from the HJ network, which does not minimize any cost function. Like the HJ network, Burel's system can separate the source signals in the presence of noise without attempting noise reduction (no noise hypotheses are assumed). Also, like the HJ system, practical convergence is not guaranteed because of the presence of local minima and computational complexity. Burel's system differs sharply from traditional supervised back-propagation applications because his cost function is not defined in terms of difference between measured and desired outputs (the desired outputs are unknown). His cost function is instead based on output signal statistics alone, which permits "unsupervised" learning in his network.

Blind Deconvolution Methods: The blind deconvolution art can be appreciated with reference to the text edited by Simon Haykin (*Blind Deconvolution*, Prentice-Hall, New Jersey, 1994), which discusses four general classes of blind deconvolution techniques, including Bussgang processes, higher-order cumulant equalization, polyspectra and maximum likelihood sequence estimation. Haykin neither considers nor suggests specific neural network techniques suitable for application to the blind deconvolution problem.

Blind deconvolution is an example of "unsupervised" learning in the sense that it learns to identify the inverse of an unknown linear time-invariant system without any physical access to the system input signal. This unknown system may be a nonminimum phase system having one or more zeroes outside the unit circle in the frequency domain. The blind deconvolution process must identify both the magnitude and the phase of the system transfer function. Although identification of the magnitude component requires only the second-order statistics of the system output signal, identification of the phase component is more difficult because it requires the higher-order statistics of the output signal. Accordingly, some form of non-linearity is needed to extract the higher-order statistical information contained in the magnitude and phase components of the output signal. Such non-linearity is useful only for unknown source signals having non-Gaussian statistics. There is no solution to the problem when the input source signal is Gaussian-distributed and the channel is nonminimum-phase because all polyspectra of Gaussian processes of order greater than two are identical to zero.

Classical adaptive deconvolution methods are based almost entirely on second order statistics, and thus fail to operate correctly for nonminimum-phase channels unless the input source signal is accessible. This failure stems from the inability of second-order statistics to distinguish minimum-phase information from maximum-phase information of the channel. A minimum phase system (having all zeroes within the unit circle in the frequency domain) exhibits a unique relationship between its amplitude response and phase response so that second order statistics in the output signal are sufficient to recover both amplitude and phase information for the input signal. In a nonminimum-phase system, second-order statistics of the output signal alone are insufficient to recover phase information and, because the system does not exhibit a unique relationship between its amplitude response and phase response, blind recovery of source signal phase information is not possible without exploiting higher-order output signal statistics. These require some form of non-linear processing because linear processing is restricted to the extraction of second-order statistics.

Bussgang techniques for blind deconvolution can be viewed as iterative polyspectral techniques, where rationale are developed for choosing the polyspectral orders with which to work and their relative weights by subtracting a source signal estimate from the sensor signal output. The Bussgang techniques can be understood with reference to Sandro Bellini (chapter 2: Bussgang Techniques For Blind Deconvolution and Equalization", *Blind Deconvolution*, S. Haykin (ed.), Prentice Hall, Englewood Cliffs, N.J., 1994), who characterizes the Bussgang process as a class of processes having an auto-correlation function equal to the cross-correlation of the process with itself as it exits from a zero-memory non-linearity.

Polyspectral techniques for blind deconvolution lead to unbiased estimates of the channel phase without any information about the probability distribution of the input source signals. The general class of polyspectral solutions to the blind decorrelation problem can be understood with reference to a second Simon Haykin textbook ("Ch. 20: Blind Deconvolution", *Adaptive Filter Theory, Second Ed.*, Simon Haykin (ed.), Prentice Hall, Englewood Cliffs, N.J., 1991) and to Hatzinakos et al. ("Ch. 5: Blind Equalization Based on Higher Order Statistics (HOS)", *Blind Deconvolution*, Simon Haykin (ed.), Prentice Hall, Englewood Cliffs, N.J., 1994).

Thus, the approaches in the art to the blind separation and deconvolution problems can be classified as those using non-linear transforming functions to spin off higher-order statistics (Jutten et al. and Bellini) and those using explicit calculation of higher-order cumulants and polyspectra (Haykin and Hatzinakos et al.). The HJ network does not reliably converge even for the simplest two-source problem and the fourth-order cumulant tensor approach does not reliably converge because of truncation of the cumulant expansion. There is accordingly a clearly-felt need for blind signal processing methods that can reliably solve the blind processing problem for significant numbers of source signals.

Unsupervised Learning Methods: In the biological sensory system arts, practitioners have formulated neural training optimality criteria based on studies of biological sensory neurons, which are known to solve blind separation and deconvolution problems of many kinds. The class of supervised learning techniques normally used with artificial neural networks are not useful for these problems because supervised learning requires access to the source signals for training purposes. Unsupervised learning instead requires some rationale for internally creating the necessary teaching signals without access to the source signals.

Practitioners have proposed several rationale for unsupervised learning in biological sensory systems. For instance, Linsker ("An Application of the Principle of Maximum Information Preservation to Linear Systems", *Advances in Neural Information Processing Systems* 1, D. S. Touretzky (ed.), Morgan-Kaufmann, (1989) shows that his well-known "infomax" principle (first proposed in 1987) explains why biological sensor systems operate to minimize information loss between neural layers in the presence of noise. In a later work ("Local Synaptic Learning Rules Suffice to Maximize Mutual Information in a Linear Network", *Neural Computation* 4 (1992) 691–702) Linsker describes a two-phase learning algorithm for maximizing the mutual information between two layers of a neural network. However, Linsker assumes a linear input-output transforming function and multivariate Gaussian statistics for both source signals and noise components. With these assumptions, Linsker shows that a "local synaptic" (biological) learning rule is sufficient to maximize mutual information but he neither considers nor suggests solutions to the more general blind processing problem of recovering non-Gaussian source signals in a non-linear transforming environment.

Simon Haykin ("Ch. 11: Self-Organizing Systems III: Information-Theoretic Models", *Neural Networks: A Comprehensive Foundation*, S. Haykin (ed.) MacMillan, New York 1994) discusses Linsker's "infomax" principle, which is independent of the neural network learning rule used in its implementation. Haykin also discusses other well-known principles such as the "minimization of information loss" principle suggested in 1988 by Plumbley et al. and Barlow's "principle of minimum redundancy", first proposed in 1961, either of which can be used to derive a class of unsupervised learning rules.

Joseph Atick ("Could information theory provide an ecological theory of sensory processing?", *Network* 3 (1992) 213–251 ) applies Shannon's information theory to the neural processes seen in biological optical sensors. Atick observes that information redundancy is useful only in noise and includes two components: (a) unused channel capacity arising from suboptimal symbol frequency distribution and (b) intersymbol redundancy or mutual information. Atick suggests that optical neurons apparently evolved to minimize the troublesome intersymbol redundancy (mutual information) component of redundancy rather than to minimize overall redundancy. H. B. Barlow ("Unsupervised Learning", *Neural Computation* 1 (1989) 295–311) also examines this issue and shows that "minimum entropy coding" in a biological sensory system operates to reduce the troublesome mutual information component even at the expense of suboptimal symbol frequency distribution. Barlow shows that the mutual information component of redundancy can be minimized in a neural network by feeding each neuron output back to other neuron inputs through anti-Hebbian synapses to discourage correlated output activity. This "redundancy reduction" principle is offered to explain how unsupervised perceptual learning occurs in animals.

S. Laughlin ("A Simple Coding Procedure Enhances a Neuron's Information Capacity", *Z. Naturforsch* 36 (1981) 910–912) proves that the optical neuron of a blowfly optimizes information capacity through equalization of the probability distribution for each neural code value (minimizing the unused channel capacity component of redundancy), thereby confirming Barlow's "minimum redundancy" principle. J. J. Hopfield ("Olfactory computation and object perception", *Proc. Natl. Acad. Sci. USA* 88 (August 1991) 6462–6466) examines the separation of odor source solution in neurons using the HJ neuron model for minimizing output redundancy.

Becker et al. ("Self-organizing neural network that discovers surfaces in random-dot stereograms", *Nature*, vol. 355, pp. 161–163, Jan. 9, 1992) propose a standard back-propagation neural network learning model modified to replace the external teacher (supervised learning) by internally-derived teaching signals (unsupervised learning). Becker et al. use non-linear networks to maximize mutual information between different sets of outputs, contrary to the blind signal recovery requirement. By increasing redundancy, their network discovers invariance in separate groups of inputs, which can be selected out of information passed forward to improve processing efficiency.

Thus, it is known in the neural network arts that anti-Hebbian mutual interaction can be used to explain the decorrelation or minimization of redundancy observed in biological vision systems. This can be appreciated with reference to H. B. Barlow et al. ("Adaptation and Decorrelation in the Cortex", *The Computing Neuron* R. Durbin et al. (eds.), Addison-Wesley, (1989) and to Schraudolph et al. ("Competitive Anti-Hebbian Learning of Invariance", *Advances in Neural Information Processing Systems* 4, J. E. Moody et al. (eds.), Morgan-Kaufmann, (1992). In fact, practitioners have suggested that Linsker's "infomax" principle and Barlow's "minimum redundancy" principle may both yield the same neural network learning procedures. Until now, however, non-linear versions of these procedures applicable to the blind signal processing problem have been unknown in the art.

The Blind Processing Problem: As mentioned above, blind source separation and blind deconvolution are related problems in signal processing. The blind source separation problem can be succinctly stated as where a set of unknown source signals $S_i(t), \ldots, S_j(t)$, are mixed together linearly by an unknown matrix $[A_{ji}]$. Nothing is known about the sources or the mixing process, both of which may be time-varying, although the mixing process is assumed to vary slowly with respect to the source. The blind separation task is to recover the original source signals from the $J \geq I$ measured superpositions of them, $X_i(t), \ldots, X_j(t)$ by finding a square matrix $[W_{ij}]$ that is a permutation of the inverse of the unknown matrix $[A_{ji}]$. The blind deconvolution problem can be similarly stated as where a single unknown signal S(t) is convolved with an unknown tapped delay-line filter $A_1, \ldots, A_l$, producing the corrupted measured signal $X(t) = A(t) * S(t)$, where A(t) is the impulse response of the unknown (perhaps slowly time-varying) filter. The blind deconvolution task is to recover S(t) by finding and convolving X(t) with a tapped delay-line filter $W_1, \ldots, W_J$ having the impulse response W(t) that reverses the effect of the unknown filter A(t).

There are many similarities between the two problems. In one, source signals are corrupted by the superposition of other source signals and, in the other, a single source signal is corrupted by superposition of time-delayed versions of itself. In both cases, unsupervised learning is required because no error signals are available and no training signals are provided. In both cases, second-order statistics alone are inadequate to solve the more general problem. For instance, a second-order decorrelation technique such as that proposed by Barlow et al. would find uncorrelated (linearly independent) projections $[Y_j]$ of the input sensor signals $[X_j]$ when attempting to separate unknown source signals $\{S_i\}$ but is limited to discovering a symmetric decorrelation matrix that cannot reverse the effects of mixing matrix $[A_{ji}]$ if the mixing matrix is asymmetric. Similarly, second-order decorrelation techniques based on the autocorrelation function, such as prediction-error filters, are phase-blind and do not offer sufficient information to estimate the phase characteristics of the corrupting filter A(t) when applied to the more general blind deconvolution problem.

Thus, both blind signal processing problems require the use of higher-order statistics as well as certain assumptions regarding source signal statistics. For the blind separation problem, the sources are assumed to be statistically independent and non-Gaussian. With this assumption, the problem of learning $[W_{ij}]$ becomes the ICA problem described by Comon. For blind deconvolution, the original signal S(t) is assumed to be a "white" process consisting of independent symbols. The blind deconvolution problem then becomes the problem of removing from the measured signal X(t) any statistical dependencies across time that are introduced by the corrupting filter A(t). This process is sometimes denominated the "whitening" of X(t).

As used herein, both the ICA procedure and the "whitening" of a time series are denominated "redundancy reduction". The first class of techniques uses some type of explicit estimation of cumulants and polyspectra, which can be appreciated with reference to Haykin and Hatzinakos et al. Disadvantageously, such "brute force" techniques are computationally intensive for high numbers of sources or taps and may be inaccurate when cumulants higher than fourth order are ignored, as they usually must be. The second class of techniques uses static non-linear functions, the Taylor series expansions of which yield higher-order terms. Iterative learning rules containing such terms are expected to be somehow sensitive to the particular higher-order statistics necessary to accurate redundancy reduction. This reasoning is used by Comon et al. to explain the HJ network and by Bellini to explain the Bussgang deconvolver. Disadvantageously, there is no assurance that the particular higher-order statistics yielded by the (heuristically) selected non-linear function are weighted in the manner necessary for achieving statistical independence. Recall that the known approach to attempting improvement of the HJ network is to test various non-linear functions selected heuristically and that the original functions are not yet improved in the art.

Accordingly, there is a need in the art for an improved blind processing method, such as some method of rigorously linking a static non-linearity to a learning rule that performs gradient ascent in some parameter guaranteed to be usefully related to statistical dependency. Until now, this was believed to be practically impossible because of the infinite number of higher-order statistics associated with statistical dependency. The related unresolved problems and deficiencies are clearly felt in the art and are solved by this invention in the manner described below.

SUMMARY OF THE INVENTION

This invention solves the above problem by introducing a new class of unsupervised learning procedures for a neural network that solve the general blind signal processing problem by maximizing joint input/output entropy through gradient ascent to minimize mutual information in the outputs. The network of this invention arises from the unexpectedly advantageous observation that a particular type of non-linear signal transform creates learning signals with the higher-order statistics needed to separate unknown source signals by minimizing mutual information among neural network output signals. This invention also arises from the second unexpectedly advantageous discovery that mutual information among neural network outputs can be minimized by maximizing joint output entropy when the learning transform is selected to match the signal probability distributions of interest.

The process of this invention can be appreciated as a generalization of the infomax principle to non-linear units with arbitrarily distributed inputs uncorrupted by any known noise sources. It is a feature of the system of this invention that each measured input signal is passed through a predetermined sigmoid function to adaptively maximize information transfer by optimal alignment of the monotonic sigmoid slope with the input signal peak probability density. It is an advantage of this invention that redundancy is minimized among a multiplicity of outputs merely by maximizing total information throughput, thereby producing the independent components needed to solve the blind separation problem.

The foregoing, together with other objects, features and advantages of this invention, can be better appreciated with reference to the following specification, claims and the accompanying drawing.

BRIEF DESCRIPTION OF THE DRAWING

For a more complete understanding of this invention, reference is now made to the following detailed description of the embodiments as illustrated in the accompanying drawing, wherein:

FIGS. 11A, 11B, 11C, 11D, 11E, 11F, 11G, 11H, 11I, 11J, 11K and 11L show time domain filter charts illustrating the results of the blind deconvolution of several different corrupted human speech signals according to the procedure of this invention.

DETAILED DESCRIPTION OF THE PREFERRED EMBODIMENTS

This invention arises from the unexpectedly advantageous observation that a class of unsupervised learning rules for maximizing information transfer in a neural network solves the blind signal processing problem by minimizing redundancy in the network outputs. This class of new learning rules is now described in information theoretic terms, first for a single input and then for a multiplicity of unknown input signals.

Information Maximization For a Single Source

Figure 4:
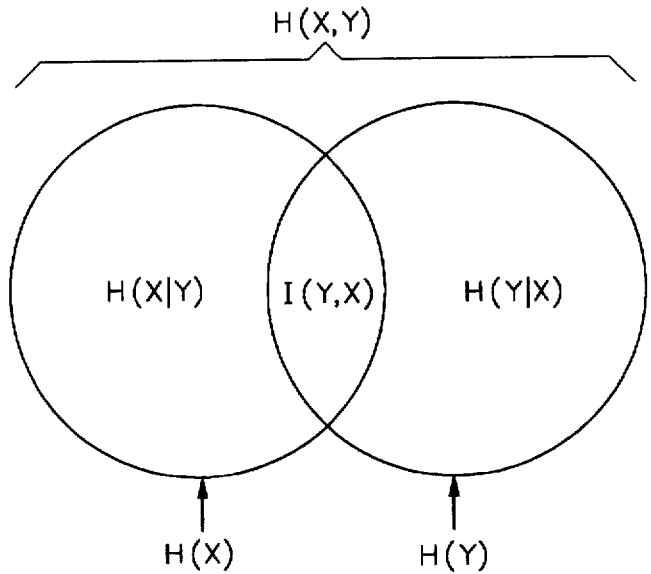
FIG. 4 shows the theoretical relationship between the several entropies and mutual information from the prior art.

In a single-input network, the mutual information that the output y of a network contains about its input x can be expressed as:

$$I(y,x) = H(y) - H(y|x) \qquad \text{[Eqn. 1]}$$

where $H(y)$ is the entropy of the output signal, $H(y|x)$ is that portion of the output signal entropy that did not come from the input signal and $I(y,x)$ is the mutual information. Eqn. 1 can be appreciated with reference to FIG. 4, which illustrates the well-known relationship between input signal entropy $H(x)$, output signal entropy $H(y)$ and mutual information $I(y,x)$.

When there is no noise or when the noise is treated as merely another unknown input signal, the mapping between input x and output y is deterministic and conditional entropy $H(y|x)$ has its lowest possible value, diverging to minus infinity. This divergence is a consequence of the generalization of information theory to continuous random variables. The output entropy $H(y)$ is really the "differential" entropy of output signal y with respect to some reference, such as the noise level or the granularity of the discrete representation of the variables in x and y. These theoretical complexities can be avoided by restricting the network to the consideration of the gradient of information theoretic quantities with respect to some parameter w. Such gradients are as well-behaved as are discrete-variable entropies because the reference terms involved in the definition of differential entropies disappear. In particular, Eqn. 1 can be differentiated to obtain the corresponding gradients as follows:

$$\frac{\partial}{\partial w} I(y,x) = \frac{\partial}{\partial w} H(y) \qquad \text{[Eqn. 2]}$$

because, in the noiseless case, $H(y|x)$ does not depend on w and its differential disappears. Thus, for continuous deterministic matchings, the mutual information between network input and network output can be maximized by maximizing the gradient of the entropy of the output alone, which is an unexpectedly advantageous consequence of treating noise as another unknown source signal. This permits the discussion to continue without knowledge of the input signal statistics.

Figure 1A:
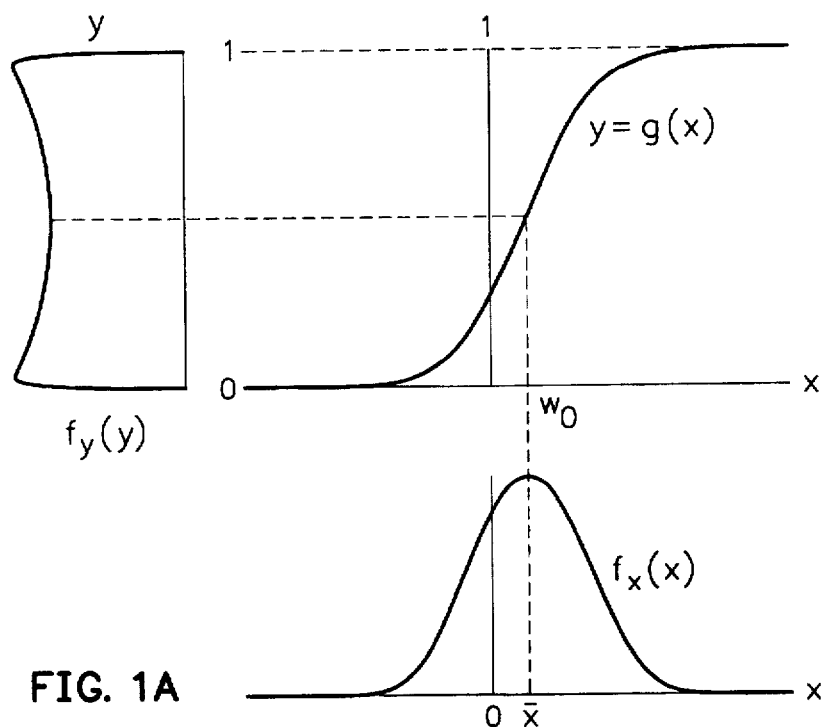
FIGS. 1A, 1B, 1C and 1D illustrate the feature of sigmoidal transfer function alignment for optimal information flow in a sigmoidal neuron from the prior art.
Figure 1B:
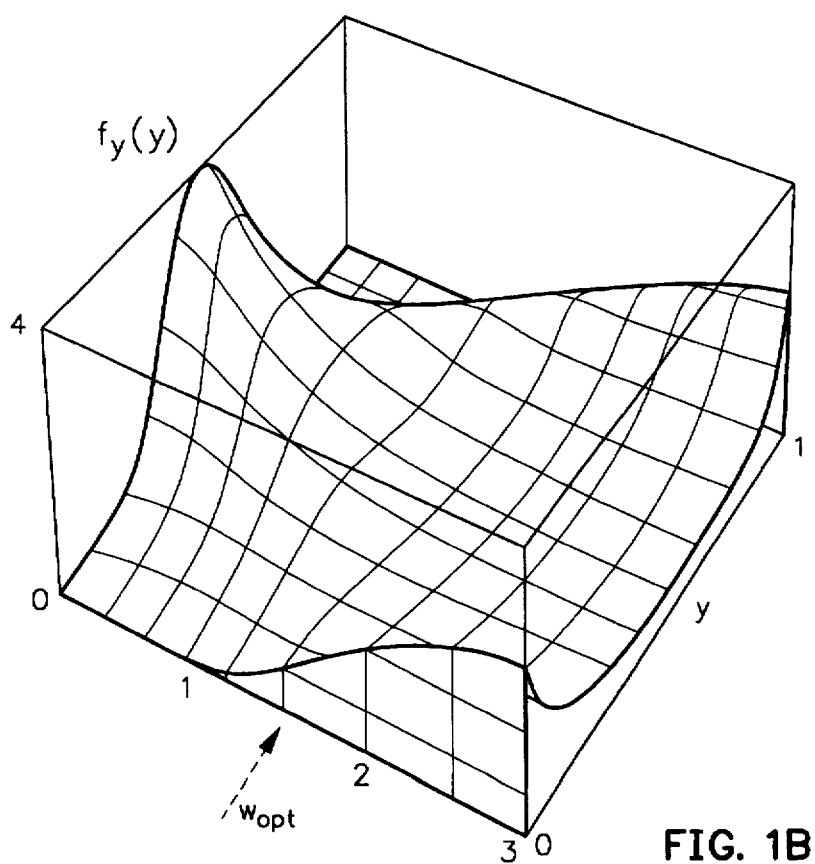
Figure 1C:
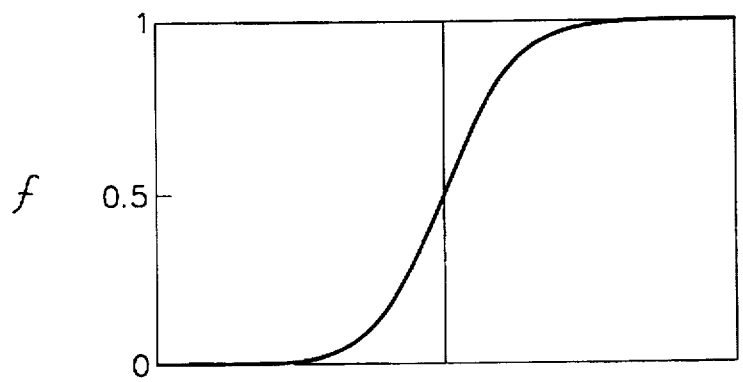
Figure 1D:
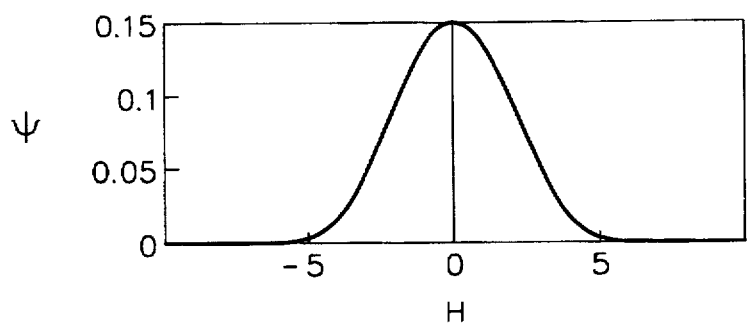

Referring to FIG. 1A, when a single input x is passed through a transforming function g(x) to give an output variable y, both $I(y,x)$ and $H(y)$ are maximized when the high density portion (mode) of the input probability density function $f_x(x)$ is aligned with the steepest sloping portion of non-linear transforming function g(x). This is equivalent to the alignment of a neuron input-output function to the expected distribution of incoming signals that leads to optimal information flow in sigmoidal neurons shown in FIGS. 1C–1D. FIG. 1D shows a zero-mode distribution matched to the sigmoid function in FIG. 1C. In FIG. 1A, the input x having a probability distribution $f_x(x)$ is passed through the non-linear sigmoidal function g(x) to produce output signal y having a probability distribution $f_y(y)$. The information in the probability density function $f_y(y)$ varies responsive to the alignment of the mean and variance of x with respect to the threshold $w_o$ and slope w of g(x). When g(x) is monotonically increasing or decreasing (thereby having a unique inverse), the output signal probability density function $f_y(y)$ can be written as a function of the input signal probability density function $f_x(x)$ as follows:

$$f_y(y) = \frac{f_x(x)}{\left|\frac{\partial y}{\partial x}\right|} \qquad \text{[Eqn. 3]}$$

where |·| denotes absolute value.

Eqn. 3 leads to the unexpected discovery of an advantageous gradient descent process because the output signal entropy can be expressed in terms of the output signal probability density function as follows:

$$H(y) = -E[\ln f_y(y)] = -\int_{-\infty}^{+\infty} f_y(y) \ln f_y(y) dy \qquad \text{[Eqn. 4]}$$

where $E[\cdot]$ denotes expected value. Substituting Eqn. 3 into Eqn. 4 produces the following:

$$H(y) = E\left[\ln\left|\frac{\partial y}{\partial x}\right|\right] - E[\ln f_x(x)] \qquad \text{[Eqn. 5]}$$

The second term on the right side of Eqn. 5 is simply the unknown input signal entropy $H(x)$, which cannot be affected by any changes in the parameter w that defines non-linear function g(x). Therefore, only the first term on the right side of Eqn. 5 need be maximized to maximize the output signal entropy $H(y)$. This first term is the average logarithm of the effect of input signal x on output signal y and may be maximized by considering the input signals as a "training set" with density $f_x(x)$ and deriving an online, stochastic gradient descent learning rule expressed as:

$$\Delta w \propto \frac{\partial H}{\partial w} = \frac{\partial}{\partial w}\left(\ln\left|\frac{\partial y}{\partial x}\right|\right) = \left(\frac{\partial y}{\partial x}\right)^{-1} \frac{\partial}{\partial w}\left(\frac{\partial y}{\partial x}\right) \qquad \text{[Eqn. 6]}$$

Eqn. 6 defines a scaling measure $\Delta w$ for changing the parameter w to adjust the log of the slope of sigmoid function. Any sigmoid function can be used to specify measure $\Delta w$, such as the widely-used logistic transfer function.

$$y = (1 - e^{-u})^{-1}, \text{ where } u = wx + w_0 \qquad \text{[Eqn. 7]}$$

in which the input x is first aligned with the sigmoid function through multiplication by a scaling weight w and addition of a bias weight $w_0$ to create an aligned signal u, which is then non-linearly transformed by the logistic transfer function to create signal y. Another useful sigmoid function is the hyperbolic tangent function expressed as y=tanh(u). The hyperbolic tangent function is a member of the general class of functions g(x) each representing a solution to the partial differential equation.

$$\frac{\partial}{\partial x} g(x) = 1 - |g(x)|^r \quad \text{[Eqn. 8]}$$

with a boundary condition of g(0)=0. The parameter r should be selected appropriately for the assumed kurtosis of the input probability distribution. For kurtosis above 3, either the hyperbolic tangent function (r=2) or the non-member logistic transfer function is well suited for the process of this invention.

For the logistic transfer function (Eqn. 7), the terms in Eqn. 6 can be expressed as:

$$\frac{\partial y}{\partial x} = wy(1-y) \quad \text{[Eqn. 9]}$$

$$\frac{\partial}{\partial w}\left(\frac{\partial y}{\partial x}\right) = y(1-y)(1+wx(1-2y)) \quad \text{[Eqn. 10]}$$

Dividing Eqn. 10 by Eqn. 9 produces a scaling measure $\Delta w$ for the scaling weight learning rule of this invention based on the logistic function:

$$\Delta w = \epsilon \cdot (x(1+2y) + w^{-1}) \quad \text{[Eqn. 11]}$$

where $\epsilon > 0$ is a learning rate.

Similar reasoning leads to a bias measure $\Delta w_0$ for the bias weight learning rule of this invention based on the logistic transfer function, expressed as:

$$\Delta w_0 = \epsilon \cdot (1-2y) \quad \text{[Eqn. 12]}$$

These two learning rules (Eqns. 11–12) are implemented by adjusting the respective w or $w_0$ at a "learning rate" ($\epsilon$), which is usually less than one percent ($\epsilon < 0.01$), as is known in the neural network arts. Referring to FIGS. 1A–1C, if the input probability density function $f_x(x)$ is Gaussian, then the bias measure $\Delta w_0$ operates to align the steepest part of the sigmoid curve g(x) with the peak $\bar{x}$ of $f_x(x)$, thereby matching input density to output slope in the manner suggested intuitively by Eqn. 3. The scaling measure $\Delta w$ operates to align the edges of the sigmoid curve slope to the particular width (proportional to variance) of $f_x(x)$. Thus, narrow probability density functions lead to sharply-sloping sigmoid functions.

The scaling measure of Eqn. 11 defines an "anti-Hebbian" learning rule with a second "anti-decay" term. The first anti-Hebbian term prevents the uninformative solutions where output signal y saturates at 0 or 1 but such an unassisted anti-Hebbian rule alone allows the slope w to disappear at zero. The second anti-decay term (1/w) forces output signal y away from the other uninformative situation where slope w is so flat that output signal y stabilizes at 0.5 (FIG. 1A).

The effect of these two balanced effects is to produce an output probability density function $f_y(y)$ that is close to the flat unit distribution function, which is known to be the maximum entropy distribution for a random variable bounded between 0 and 1. FIG. 1B shows a family of sigmoid output distributions, with the most informative one occurring at sigmoid slope $w_{opt}$. Using the logistic transfer function as the non-linear sigmoid transformation, the learning rule in Eqn. 11 eventually brings the slope w to $w_{opt}$, thereby maximizing entropy in output signal y. The bias rule in Eqn. 12 centers the mode in the sloping region at $w_0$ (FIG. 1A).

If the hyperbolic tangent sigmoid function is used, the bias measure $\Delta w_0$ then becomes proportional to $-2y$ and the scaling measure $\Delta w$ becomes proportional to $-2xy + w^{-1}$, such that $\Delta w_0 = -2y\epsilon$ and $\Delta w = \epsilon(-2xy + w^{-1})$, where $\epsilon$ is the learning rate. These learning rules offer the same general features and advantages of the learning rules discussed above in connection with Eqns. 10–11 for the logistic transfer function. In general, any sigmoid function in the class of solutions to Eqn. 8 selected for parametric suitability to a particular input probability distribution can be used in accordance with the process of this invention to solve the blind signal processing problem. These unexpectedly advantageous learning rules can be generalized to the multi-dimensional case.

Joint Entropy Maximization for Multiple Sources

Figure 2A:
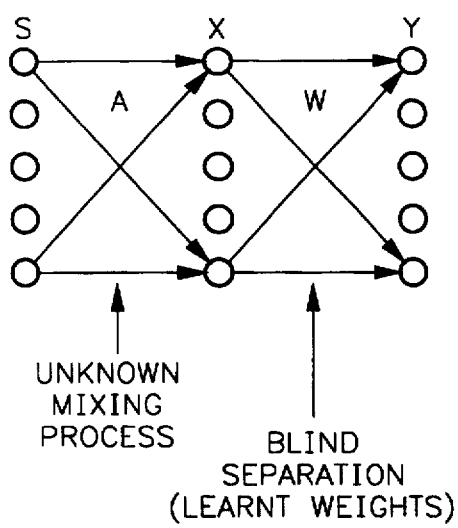
FIGS. 2A, 2B and 2C illustrate the blind source separation and blind deconvolution problems from the prior art.

To appreciate the multiple-signal blind processing method of this invention, consider the general network diagram shown in FIG. 2A where the measured input signal vector [X] is transformed by way of the weight matrix [W] to produce a monotonically transformed output vector $[Y]=g([W][X]+[W_0])$. By analogy to Eqn. 3, the multivariate probability density function of [Y] can be expressed as $$f_Y(Y) = \frac{f_X(X)}{|J|} \quad \text{[Eqn. 13]}$$

where $|J|$ is the absolute value of the Jacobian of the transformation that produces output vector [Y] from input vector [X]. As is well-known in the art, the Jacobian is the determinant of the matrix of partial derivatives:

$$J = \det \begin{bmatrix} \frac{\partial y_1}{\partial x_1} & \cdots & \frac{\partial y_1}{\partial x_N} \\ \vdots & & \vdots \\ \frac{\partial y_N}{\partial x_1} & \cdots & \frac{\partial y_N}{\partial x_N} \end{bmatrix} \quad \text{[Eqn. 14]}$$

where $\det[\cdot]$ denotes the determinant of a square matrix.

By analogy to the single-input case discussed above, the method of this invention maximizes the natural log of the Jacobian to maximize output entropy H(Y) for a given input entropy H(X), as can be appreciated with reference to Eqn. 5. The quantity $\ln|J|$ represents the volume of space in [Y] into which points in [X] are mapped. Maximizing this quantity attempts to spread the training set of input points evenly [Y].

For the commonly-used logistic transfer function, the resulting learning rules can be proven to be as follows:

$$[\Delta W] = \epsilon \cdot (([1]-2[Y])[X]^T + [[W]^T]^{-1}) \quad \text{[Eqn. 15]}$$

$$[\Delta W_0] = \epsilon \cdot ([1]-2[Y]) \quad \text{[Eqn. 16]}$$

In Eqn. 15, the first anti-Hebbian term has become an outer product of vectors and the second anti-decay term has generalized to an "anti-redundancy" term in the form of the inverse of the transpose of the weight matrix [W]. Eqn. 15 can be written, for an individual weight $W_{ij}$ as follows:

$$\Delta W_{ij} = \epsilon \cdot \left( \frac{\text{cof}[W_{ij}]}{\det[W]} + X_j(1-2Y_i) \right) \quad \text{[Eqn. 17]}$$

where $\text{cof}[W_{ij}]$ denotes the cofactor of element $W_{ij}$, which is known to be $(-1)^{i+j}$ times the determinant of the matrix obtained by removing the $i^{th}$ row and the $j^{th}$ column from the square weight matrix [W] and $\epsilon$ is the learning rate. Similarly, the $i^{th}$ bias measure $\Delta W_{i0}$ can be expressed as follows:

$$\Delta W_{i0} = \epsilon \cdot (1 - 2Y_i) \quad \text{[Eqn. 18]}$$

The rules shown in Eqns. 17-18 are the same as those for the single unit mapping (Eqns. 11-12) except that the instability occurs at det[W]=0 instead of w=0. Thus, any degenerate weight matrix leads to instability because any weight matrix having a zero determinant is degenerate. This fact enables different outputs $Y_i$ to learn to represent different things about the inputs $X_j$. When the weight vectors entering two different outputs become too similar, det[W] becomes small and the natural learning process forces these approaching weight vectors apart. This effect is mediated by the numerator cof[$W_{ij}$], which approaches zero to indicate degeneracy in the weight matrix of the rest of the layer not associated with input $X_j$ or output $Y_i$.

Other sigmoidal transformations yield other training rules that are similarly advantageous as discussed above in connection with Eqn. 8. For instance, the hyperbolic tangent function yields rules very similar to those of Eqns. 17-18.

$$\Delta W_{ij} = \epsilon \cdot \left( \frac{\text{cof}[W_{ij}]}{\det[W]} - 2X_j Y_i \right) \quad \text{[Eqn. 19]}$$

$$\Delta W_{i0} = \epsilon \cdot (-2Y_i) \quad \text{[Eqn. 20]}$$

The usefulness of these blind source separation network learning rules can be appreciated with reference to the discussion below in connection with FIG. 5.

Blind Deconvolution in a Causal Filter

Figure 2B:
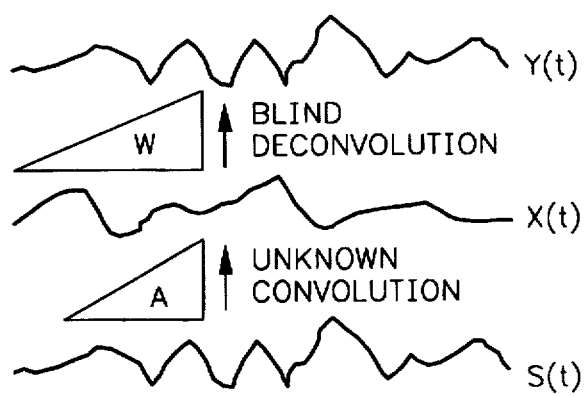
Figure 2C:
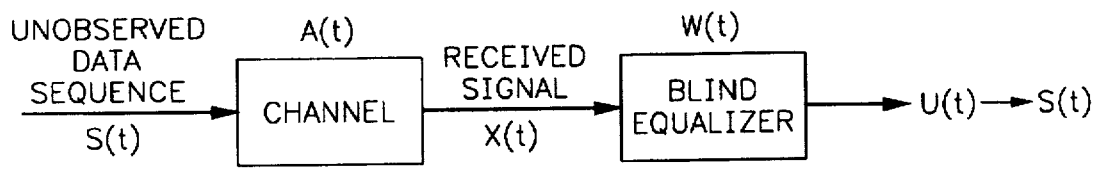

FIGS. 2B-2C illustrate the blind deconvolution problem. FIG. 2C shows an unobserved data sequence S(t) entering an unknown channel A(t), which responsively produces the measured signal X(t) that can be blindly equalized through a causal filter W(t) to produce an output signal U(t) approximating the original unobserved data sequence S(t). FIG. 2B shows the time series X(t), which is presumed to have a length of J samples (not shown). X(t) is convolved with a causal filter having I weighted taps, $W_I, \ldots, W_I$ and impulse response W(t). The causal filter output signal U(t) is then passed through a non-linear sigmoid function g(·) to create the training signal Y(t) (not shown). This system can be expressed either as a convolution (Eqn. 21) or as a matrix equation (Eqn. 22) as follows:

$$Y(t) = g(W(t) * X(t)) \quad \text{[Eqn. 21]}$$

$$[y] = g([W][X]) \quad \text{[Eqn. 22]}$$

in which [Y]=g([U]) and [X] are signal sample vectors having J samples. Of course, the vector ordering need not be temporal. For causal filtering, [W] is a banded lower triangular JxJ square matrix expressed as:

$$[W] = \begin{bmatrix} W_1 & 0 & \ldots & 0 & 0 \\ W_2 & W_1 & \ldots & 0 & 0 \\ \cdot & \cdot & & \cdot & \cdot \\ \cdot & \cdot & & \cdot & \cdot \\ \cdot & \cdot & & \cdot & \cdot \\ W_I & \ldots & W_1 & \ldots & 0 \\ \cdot & \cdot & & \cdot & \cdot \\ \cdot & \cdot & & \cdot & \cdot \\ \cdot & \cdot & & \cdot & \cdot \\ 0 & 0 & \ldots & W_1 & W_2 \\ 0 & 0 & \ldots & 0 & W_1 \end{bmatrix} \quad \text{[Eqn. 23]}$$

Assuming an ensemble of time series, the joint probability distribution functions $f_{[y]}([Y])$ and $f_{[X]}([X])$ are related by the Jacobian of the Eqn. 22 transformation according to Eqn. 13. The ensemble can be "created" from a single time series by breaking the series into sequences of length I, which reduces [W] in Eqn. 23 to an IxI lower triangular matrix. The Jacobian of the transformation is then written as follows:

$$J = \det\left[ \frac{\partial Y(t_i)}{\partial X(t_j)} \right]_{ij} = (\det[W]) \prod_{t=1}^{J} \frac{dY(t)}{dU(t)} \quad \text{[Eqn. 24]}$$

which may be decomposed into the determinant of the weight matrix [W] of Eqn. 23 and the product of the slopes of the sigmoidal squashing function for all times t. Because [W] is lower-triangular, its determinant is merely the product of the diagonal values, which is $W_1^J$. As before, the output signal entropy H(Y) is maximized by maximizing the logarithm of the Jacobian, which may be written as:

$$\ln|J| = \ln|W_1^J| + \sum_{t=1}^{J} \ln\left| \frac{dY(t)}{dU(t)} \right| \quad \text{[Eqn. 25]}$$

If the hyperbolic tangent is selected as the non-linear sigmoid function, then differentiation with respect to the filter weights W(t) provides the following two simple learning rules:

$$\Delta W_1 = \epsilon \cdot \sum_{j=1}^{J} \left( \frac{1}{W_1} - 2X_j Y_j \right) \quad \text{[Eqn. 26]}$$

$$\Delta W_i = \epsilon \cdot \sum_{j=1}^{J} (-2X_{i+j-1} Y_j), \text{ where } i > 1 \quad \text{[Eqn. 27]}$$

In Eqns. 26-27, $W_1$ is the "leading weight" and $W_i(i=2, \ldots, I)$ represent the remaining weights in a delay line having I weighted taps linking the input signal sample $X_{i+j-1}$ to the output signal sample $Y_j$. The leading weight $W_1$ therefore adapts like a weight connected to a neuron with only that one input (Eqn. 11 above). The other tap weights $\{W_i\}$ attempt to decorrelate the past input from the present output. Thus, the leading weight $W_1$ keeps the causal filter from "shrinking".

Other sigmoidal functions may be used to generate similarly useful learning rules, as discussed above in connection with Eqn. 8. The equivalent rules for the logistic transfer function discussed above can be easily deduced to be:

$$\Delta W_1 = \epsilon \cdot \sum_{j=1}^{J} \left( \frac{1}{W_1} + X_j(1 - 2Y_j) \right) \quad \text{[Eqn. 28]}$$

$$\Delta W_i = \epsilon \cdot \sum_{j=1}^{J} X_{i+j-1}(1 - 2Y_j), \text{ where } i > 1 \quad \text{[Eqn. 29]}$$

The usefulness of these causal filter learning rules can be appreciated with reference to the discussion below in connection with FIGS. 6 and 7.

Information Maximization v. Statistical Dependence

The process of this invention relies on the unexpectedly advantageous observation that, under certain conditions, the maximization of the mutual information I(Y,X) operates to minimize the mutual information between separate outputs $\{U_i\}$ in a multiple source network, thereby performing the redundancy reduction required to solve the blind signal processing problem. The usefulness of this relationship was unsuspected until now. When limited to the usual logistic transfer or hyperbolic tangent sigmoid functions, this invention appears to be limited to the general class of super-Gaussian signals having kurtosis greater than 3. This limitation can be understood by considering the following example shown in FIGS. 3A-3C.

Figure 3A:
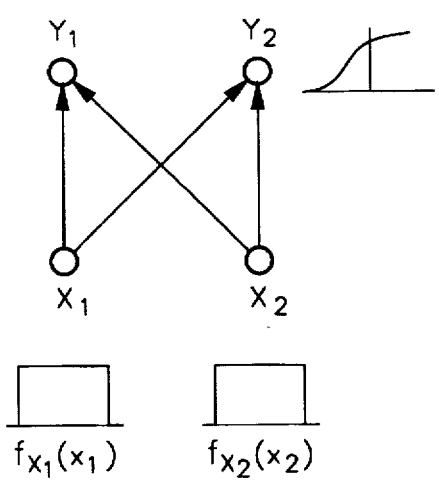
FIGS. 3A, 3B and 3C provide graphical diagrams illustrating a joint entropy maximization example where maximizing joint entropy fails to produce statistically independent output signals because of improper selection of the non-linear transforming function.
Figure 3B:
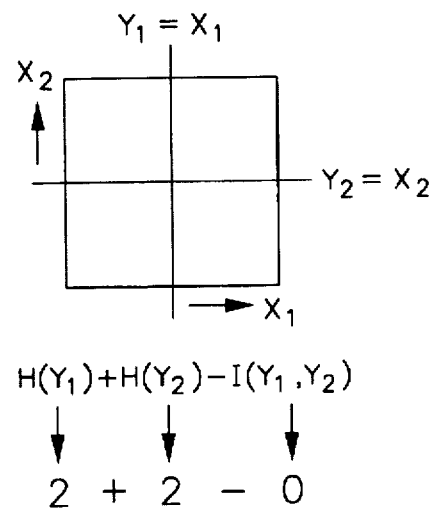

Referring to FIG. 3A, consider a network with two outputs $y_1$ and $Y_2$, which may be either two output channels from a blind source separation network or two signal samples at different times for a blind deconvolution network. The joint entropy of these two variables can be written as:

$$H(y_1,y_2)=H(y_1)+H(y_2)-I(y_1,y_2) \quad \text{[Eqn. 30]}$$

Thus, the joint entropy can be maximized by maximizing the individual entropies while minimizing the mutual information $I(y_1,y_2)$ shared between the two. When the mutual information $I(y_1,y_2)$ is zero, the two variables $y_1$ and $y_2$ are statistically independent and the joint probability density function is equal to the product of the individual probability density functions so that $f_{y_1y_2}(y_1,y_2)=f_{y_1}(y_1)f_{y_2}(y_2)$. Both the ICA and the "whitening" approach to deconvolution are examples of pair-wise minimization of mutual information $I(y_1,y_2)$ for all pairs $y_1$ and $y_2$. This process is variously denominated factorial code learning, predictability minimization, independent component analysis ICA and redundancy reduction.

The process of this invention is a stochastic gradient ascent procedure that maximizes the joint entropy $H(y_1,y_2)$, thereby differing sharply from these "whitening" and ICA procedures known for minimizing mutual information $I(y_1, y_2)$. The system of this invention rests on the unexpectedly advantageous discovery of the general conditions under which maximizing joint entropy operates to reduce mutual information (redundancy), thereby reducing the statistical dependence of the two outputs $y_1$ and $Y_2$.

Figure 3C:
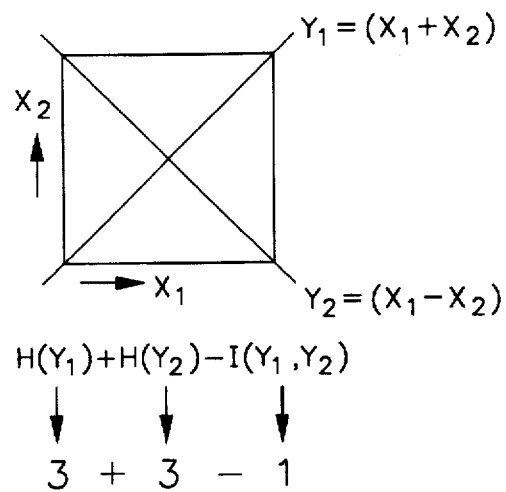

Under many conditions, maximizing joint entropy $H(y_1, y_2)$ does not guarantee minimization of mutual information $I(y_1,y_2)$ because of interference from the other single entropy terms $H(y_i)$ in Eqn. 30. FIG. 3C shows one pathological example where a "diagonal" projection of two independent, uniformly-distributed variables $x_1$ and $x_2$ is preferred over the "independent" projection shown in FIG. 3B when joint entropy is maximized. This occurs because of a mismatch between the requisite alignment of input probability distribution function and sigmoid slope discussed above in connection with FIGS. 1A–1C and Eqn. 8. The learning procedure of this invention achieves the higher value of mutual entropy shown in FIG. 3C than the desired value shown in FIG. 3B because of the higher individual output entropy values $H(y_i)$ arising from the triangular probability distribution functions of $(x_1+x_2)$ and $(x_1-x_2)$ of FIG. 3C, which more closely match the sigmoid slope (not shown). This interferes with the minimization of mutual information $I(y_1,y_2)$ because the individual entropy $H(y_i)$ increases offset or mask undesired increases in mutual information to provide the higher joint entropy $H(y_1,y_2)$ sought by the process.

The inventor believes that such interference has little significant effect in most practical situations, however. As mentioned above in connection with Eqn. 8, the sigmoidal function is not limited to the usual two functions and indeed can be tailored to the particular class of probability distribution functions expected by the process of this invention. Any function that is a member of the class of solutions to the partial differential Eqn. 8 provides a sigmoidal function suitable for use with the process of this invention. It can be shown that this general class of sigmoidal functions leads to the following two learning rules according to this invention:

$$\Delta W_{ij} = \epsilon \cdot \left( \frac{cof[W_{ij}]}{det[W]} - rX_jY_i^{r-1}\text{sgn}(Y_j) \right) \quad \text{[Eqn. 31]}$$

$$\Delta W_{i0} = \epsilon \cdot (- rX_jY_i^{r-1}\text{sgn}(Y_i)) \quad \text{[Eqn. 32]}$$

$$\text{where sgn}(Y_i) = \begin{cases} +1 \text{ for } Y_i > 0 \\ 0 \text{ for } Y_i = 0 \\ -1 \text{ for } Y_i < 0 \end{cases}$$

and where parameter r is chosen appropriately for the presumed kurtosis of the probability distribution function of the source signals $[S_i]$. This formalism can be extended to covered skewed and multimodal input distribution by extending Eqn. 8 to produce an increasingly complex polynomial in g(x) such that $$\frac{\partial}{\partial x} g(x) = G(g(x)).$$

Figure 8A:
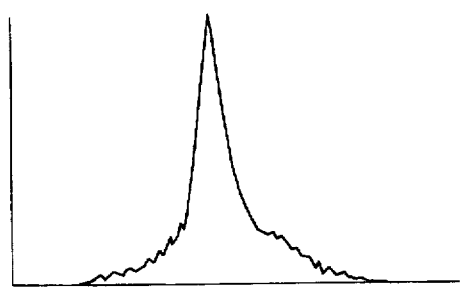
FIGS. 8A, 8B and 8C show typical probability density functions for speech, rock music and Gaussian white noise.
Figure 8B:
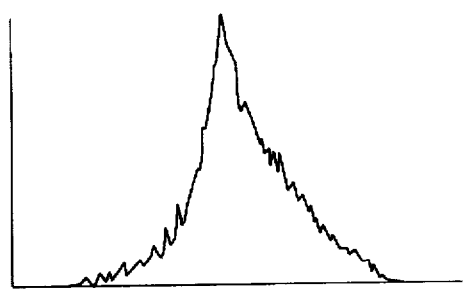
Figure 8C:
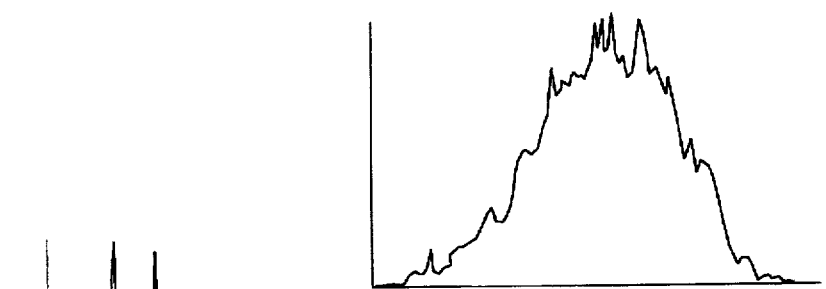

Even with the usual logistic transfer function (Eqn. 7) and the hyperbolic tangent function (r=2), it appears that the problem of individual entropy interference is limited to sub-Gaussian probability distribution functions having a kurtosis less than 3. Advantageously, many actual analog signals, including the speech signals used in the experimental verification of the system of this invention, are super-Gaussian in distribution. They have longer tails and are more sharply peaked than the Gaussian distribution, as may be appreciated with reference to the three distribution functions shown in FIGS. 8A–8C. FIG. 8A shows a typical speech probability distribution function, FIG. 8B shows the probability distribution function for rock music and FIG. 8C shows a typical Gaussian white noise distribution. The inventor has found that joint entropy maximization for sigmoidal networks always minimizes the mutual information between the network outputs for all super-Gaussian signal distributions tested. Special sigmoid functions can be selected that are suitable for accomplishing the same result for sub-Gaussian signal distributions as well, although the precise learning rules must be selected in accordance with the parametric learning rules of Eqns. 31–32.

Different sigmoid non-linearities provide different anti-Hebbian terms. Table 1 provides the anti-Hebbian terms from the learning rules resulting from several interesting non-linear transformation functions. The information-maximization rule consists of an anti-redundancy term which always has a form of $[[W]^T]^{-1}$ and an anti-Hebbian term that keeps the unit from saturating.

TABLE 1

| Function: | Slope: | Anti Hebb term: |
|---|---|---|
| $y_i = g(u_i)$ | $y_i' = \frac{\partial y_i}{\partial u_i}$ | $\frac{\partial}{\partial w_{ij}} \ln|y_i'|$ |
| $\frac{1}{1+e^{-u_i}}$ | $y_i(1 - y_i)$ | $x_j(1 - 2y_i)$ |
| $\tanh(u_i)$ | $(1 - |y_i|^2)$ | $-2x_jy_i$ |
| Eqn. 8 solution | $1 - |y_i|^r$ | $-rx_j|y_i|\text{sgn}(y_i)$ |
| $\arctan(u_i)$ | $\frac{1}{1+u_i^2}$ | $-\frac{2x_ju_i}{1+u_i^2}$ |
| $\text{erf}(u_i)$ | $\frac{2}{\sqrt{\pi}} e^{-u_i^2}$ | $-2x_ju_i$ |
| $e^{-u_i^2}$ | $-2u_iy_i$ | $x_j\frac{1+2u_i^2}{u_i}$ |

Table 1 shows that only the Eqn. 8 solutions (including the hyperbolic tangent function for r=2) and the logistic transfer functions produce anti-Hebbian terms that can yield higher-order statistics. The other functions use the net input $u_i$ as the output variable rather using the actual transformed output $y_i$. Tests performed by the inventor show that the erf function is unsuitable for blind separation. In fact, stable weight matrices using the $-2x_ju_i$ can be calculated from the covariance matrix of the inputs alone. The learning rule for a Gaussian radial basis function node is interesting because it contains $u_i$ in both the numerator and denominator. The denominator term limits the usefulness of such a rule because data points near the radial basis function center would cause instability. Radial transfer functions are generally appropriate only when input distributions are annular.

Illustrative Networks

Figure 5:
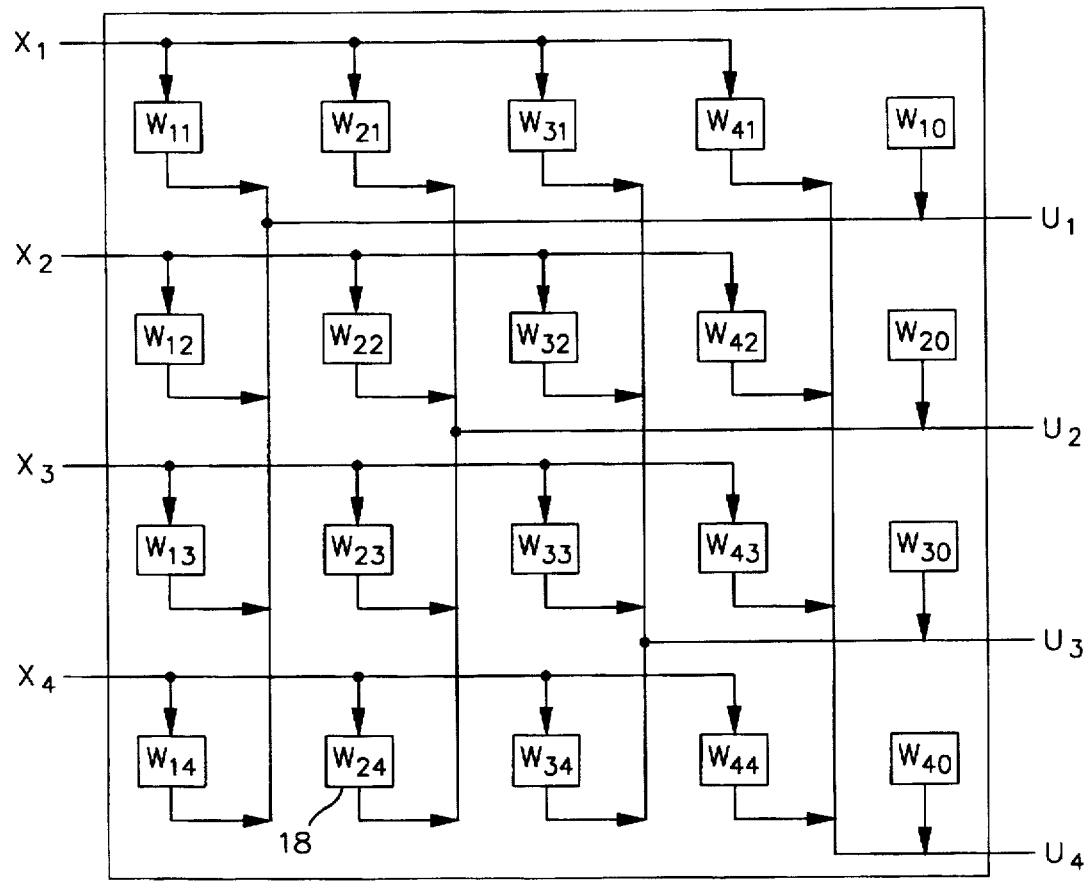
FIG. 5 shows a functional block diagram of an illustrative embodiment of the source separation network of this invention.

FIG. 5 shows a functional block diagram illustrating an exemplary embodiment of a four-port blind signal separation network according to this invention. Each of the four input signals $\{X_i\}$ represents "sensor" output signals such as the electrical signal received from a microphone at a "cocktail party" or an antenna output signal. Each of the four network output signals $\{U_i\}$ is related to the four input signals by weights so that $[U_i]=[W_{ij}][X_j]+[W_{i0}]$. The four bias weights $\{W_{i0}\}$ are updated regularly according to the learning rule of Eqn. 18 discussed above and each of the sixteen scaling weights $\{W_{ij}\}$ are updated regularly according to the learning rule of Eqn. 17 discussed above. These updates can occur after every signal sample or may be accumulated over many signal samples for updating in a global mode. Each of the weight elements in FIG. 5 exemplified by element 18 includes the logic necessary to produce and accumulate the $\Delta W$ update according to the applicable learning rule.

The separation network in FIG. 5 can also be used to remove interfering signals from a receive signal merely by, for example, isolating the interferer as output signal $U_I$ and then subtracting $U_I$ from the receive signal of interest, such as receive signal $X_I$. In such a configuration, the network shown in FIG. 5 is herein denominated a "interference cancelling" network.

Figure 6:
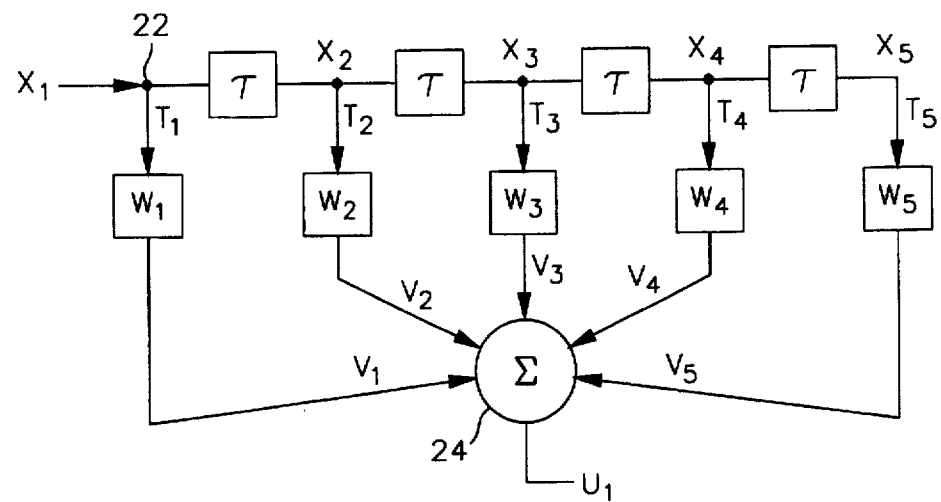
FIG. 6 is a functional block diagram of an illustrative embodiment of the blind decorrelating network of this invention.

FIG. 6 shows a functional block diagram illustrating a simple causal filter operated according to the method of this invention for blind deconvolution. A time-varying signal is presented to the network at input 22. The five spaced taps $\{T_i\}$ are separated by a time-delay interval $\tau$ in the manner well-known in the art for transversal filters. The five weight factors $\{W_i\}$ are established and updated by internal logic (not shown) according to the learning rules shown in Eqns. 26–27 discussed above. The five weighted tap signals $\{U_i\}$ are summed at a summation device 24 to produce the single time-varying output signal $U_I$. Because input signal $X_I$ includes an unknown non-linear combination of time-delayed versions of an unknown source signal $S_I$, the system of this invention adjusts the tap weights $\{W_i\}$ such that output signal $U_I$ approximates the unknown source signal $S_I$.

Figure 7:
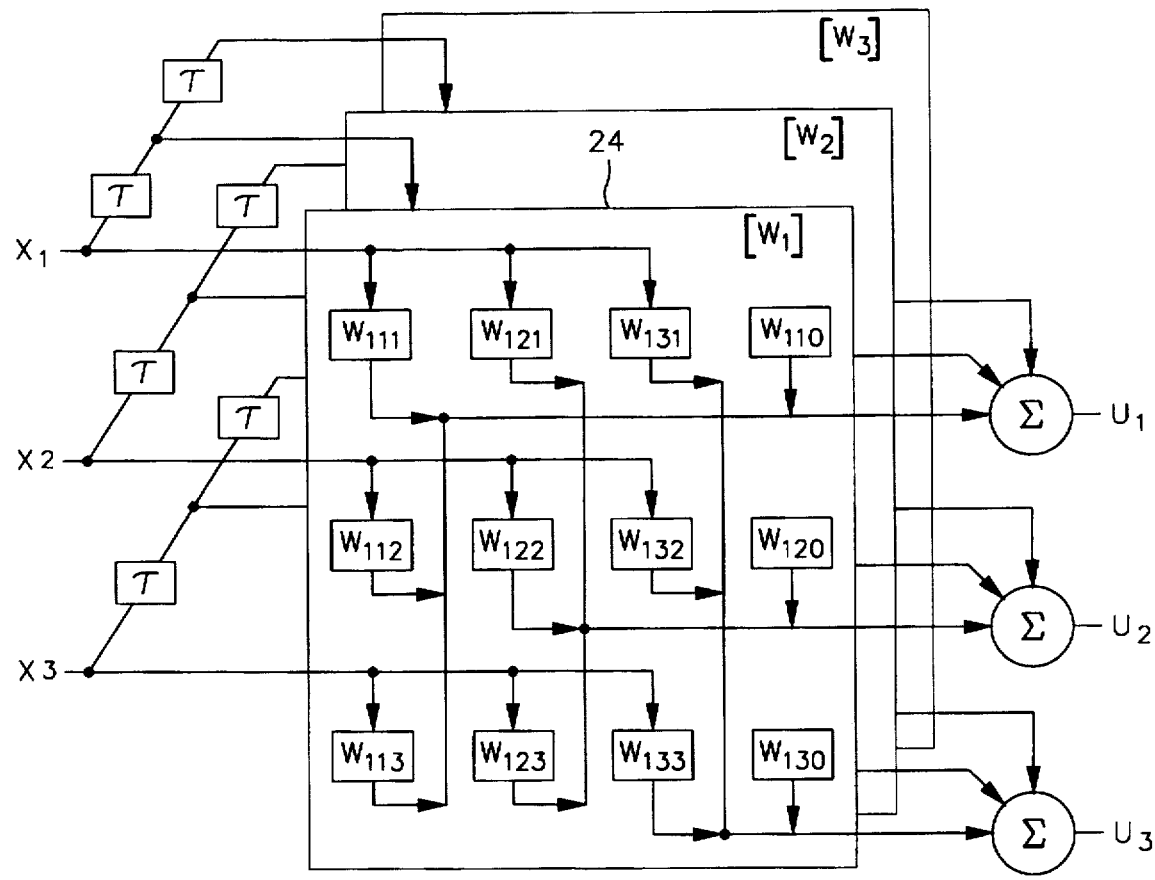
FIG. 7 is a functional block diagram of an illustrative embodiment of the combined blind source separation and blind decorrelation network of this invention.

FIG. 7 shows a functional block diagram illustrating the combination of blind source separation network and blind deconvolution filter systems of this invention. The blind separation learning rules and the blind deconvolution rules discussed above can be easily combined in the form exemplified by FIG. 7. The objective is to maximize the natural logarithm of a Jacobian with local lower triangular structure, which yields the expected learning rule that forces the leading weights $\{W_{ijk}\}$ in the filters to follow the blind separation rules and all others to follow a decorrelation rule except that tapped weights $\{W_{ijk}\}$ are interposed between a delayed input and an output.

The outputs $\{U_j\}$ are used to produce a set of training signals given by Eqn. 33:

$$Y_j(t) = g(U_j(t)) = g\left( \sum_{k=1}^{K} \sum_{i=1}^{I} W_{ijk}X_k(t-(I-i+1)\tau) \right) \quad \text{[Eqn. 33]}$$

where $g(\cdot)$ denotes the selected sigmoidal transfer function. If the hyperbolic tangent function is selected as the sigmoidal non-linearity, the following training rules are used in the system of this invention:

$$\Delta W_{1jk} = \epsilon \cdot \left( \frac{cof[W_{1jk}]}{det[W_1]} - 2X_kY_j \right) \quad \text{[Eqn. 34]}$$

$$\Delta W_{ijk} = \epsilon \cdot (-2X_{k,j-1}Y_j) \text{ when } i > 1 \quad \text{[Eqn. 35]}$$

where $\Delta W_{ijk}$ are the elements of the "lead" plane and $\epsilon$ is the learning rate.

In FIG. 7, each of the three input signals $\{X_k\}$ contain multipath distortion that requires blind deconvolution as well as an unknown mixture of up to three unknown source signals $\{S_k\}$. Each of the source separation planes, exemplified by plane 24, operates substantially as discussed above in connection with FIG. 5 for the three input signals $\{X_k\}$, by providing three output contributions to the summing elements exemplified by summing circuit 26. Plane 24 contains the lead weights for the 16 individual causal filters formed by the network. Preliminary experiments performed by the inventor with speech signals in which signals were simultaneously separated and deconvolved using the learning rule discussed above resulted in recovery of apparently perfect speech.

Experimental Results

The inventor conducted experiments using three-second segments of speech recorded from various speakers with only one speaker per recording. All speech segments were sampled at 8,000 Hz from the output of the auxiliary microphone of a Sparc-10 workstation. No special post-processing was performed on the waveforms other than the normalization of amplitudes to a common interval [−3,3] to permit operation with the equipment used. The network was trained using the stochastic gradient ascent procedure of this invention.

Unsupervised learning in a neural network may proceed either continuously or in a global mode. Continuous learning consists in slightly modifying the weights after each propagation of an input vector through the network. This kind of learning is useful for signals that arrive in real time or when local storage capacity is restricted. In a global learning mode, a multiplicity of samples are propagated through the network and the results stored locally. Statistics are computed exactly on these data and the weights are modified only after accumulating and processing the multiplicity of signal samples.

To reduce computational overhead, these experiments were performed using the global learning mode. To ensure that the input ensemble is stationary in time, random points were selected from the three-second window to generate the appropriate input vectors. Various learning rates were tested, with 0.005 preferred. As used herein, learning rate $\epsilon$ establishes the actual weight adjustment such that $W_{ij}=W_{ij}+\epsilon \Delta W_{ij}$, as is known in the art. The inventor found that reducing the learning rate over the learning process was useful.

Blind Separation Results: The network architecture shown in FIGS. 2A and 5 together with the learning rules in Eqns. 17–18 were found to be sufficient to perform blind separation of at least seven unknown source signals. A random mixing matrix [A] was generated with values usually in the interval [−1,1]. The mixing matrix [A] was used to generate the several mixed time series $[X_j]$ from the original sources [$S_j$]. The unmixing matrix [W] and the bias vector [$W_0$] were then trained according to the rules in Eqns. 17–18.

Figure 10:
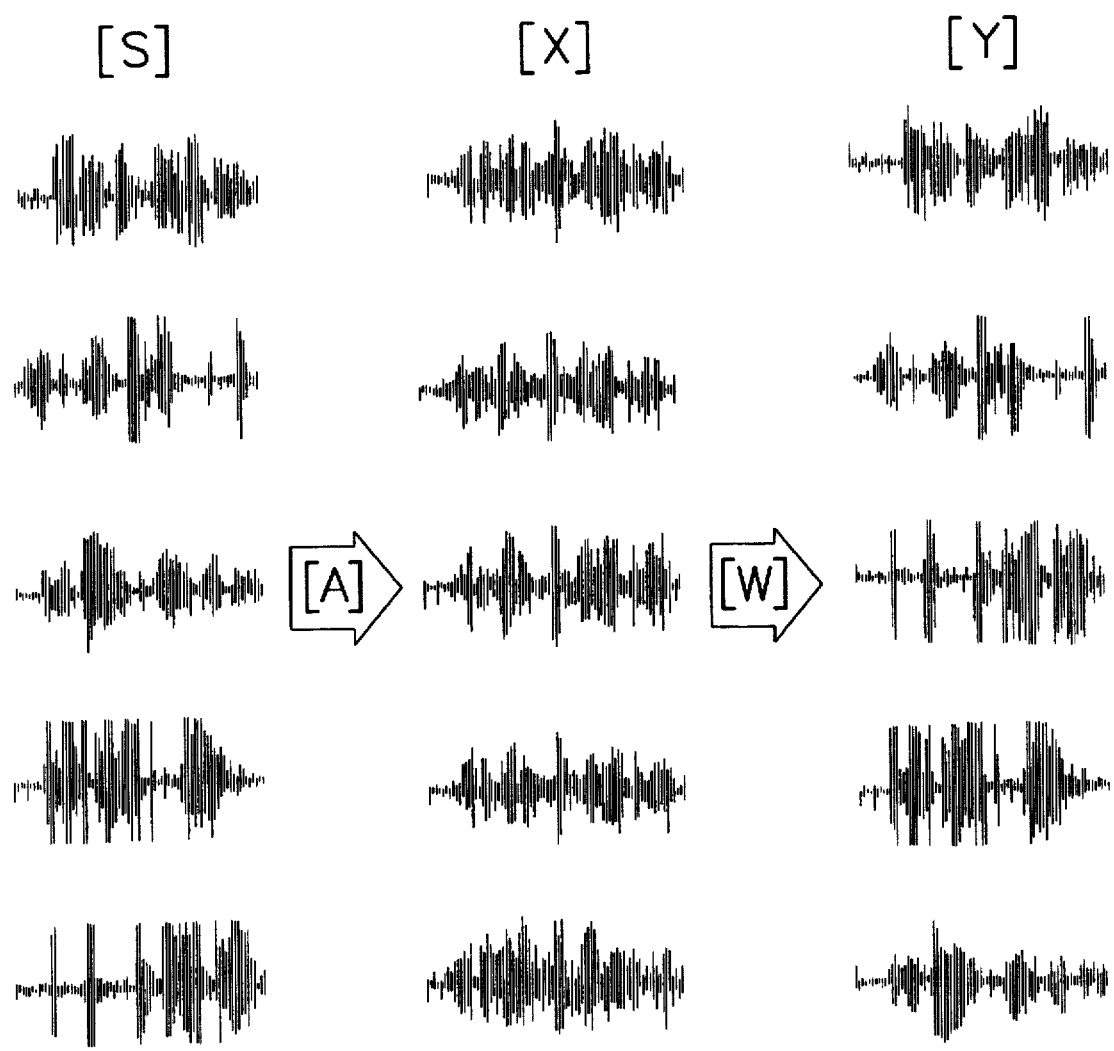
FIG. 10 shows the results of a blind source separation experiment performed using the procedure of this invention.

FIG. 10 shows the results of the attempted separation of five source signals. The mixtures [$X_j$] formed an incomprehensible babble that could not be penetrated by the human ear. The unmixed solutions shown as [$Y_i$] were obtained after presenting about 500,000 time samples, equivalent to 20 passes through the complete three-second series. Any residual interference in the output vector elements [$Y_i$] is inaudible to the human ear. This can be appreciated with reference to the permutation structure of the product of the final weight matrix [W] and the initial mixing matrix [A]:

$$[W][A] = \begin{bmatrix} -4.09 & 0.13 & 0.09 & -0.07 & -0.01 \\ 0.07 & -2.92 & 0.00 & 0.02 & -0.06 \\ 0.02 & -0.02 & -0.06 & -0.08 & -2.20 \\ 0.02 & 0.03 & 0.00 & 1.97 & 0.02 \\ -0.07 & 0.14 & -3.50 & -0.01 & 0.04 \end{bmatrix}$$

As can be seen, the residual interference factors are only a few percent of the single substantial entry in each row and column, thereby demonstrating that weight matrix [W] substantially removes all effects of mixing matrix [A] from the signals.

In a second experiment, seven source signals, including five speaking voices, a rock music selection and white noise, were successfully separated, although the separation was still slowly improving after 2.5 million iterations, equivalent to 100 passes through the three-second data. For two sources, convergence is normally achieved in less than one pass through the three seconds of data by the system of this invention.

The blind separation procedure of this invention was found to fail only when: (a) more than one unknown source is Gaussian white noise, and (b) when the mixing matrix [A] is nearly singular. Both weaknesses are understandable because no procedure can separate independent Gaussian sources and, if [A] is nearly singular, then any proper unmixing matrix [W] must also be nearly singular, making the expression in Eqn. 17 quite unstable in the vicinity of a solution.

In contrast with these results, experience with similar tests of the HJ network shows it occasionally fails to converge for two sources and rarely converges for three sources.

Blind Deconvolution Results: Speech signals were convolved with various filters and the learning rules in Eqns. 26–27 were used to perform blind deconvolution. Some results are shown in FIGS. 11A–11L. The convolving filter time domains shown in FIGS. 11A, 11E and 11I, contained some zero values. For example, FIG. 11E represents the filter [0.8,0,0,0,1]. Moreover, the taps were sometimes adjacent to each other, as in FIGS. 11A–11D, and sometimes spaced apart in time, as in FIGS. 11I–11L. The leading weight of each filter is the right-most bar in each histogram, exemplified by bar 30 in FIG. 11I and bar 32 in FIG. 11G.

A whitening experiment is shown in FIGS. 11A–11D, a barrel-effect experiment in FIGS. 11E–11H and multiple-echo experiment in FIGS. 11I–11L. For each of these three experiments, the time domain characteristics of convolving filter [A] is shown followed by those of the ideal deconvolving filter [$W_{ideal}$], those of the filter produced by the process of this invention [W] and the time domain pattern produced by convolution of [W] and [A]. Ideally, the convolution [W]*[A] should be a delta-function consisting of only a single high value at the right-most position of the leading weight when [W] correctly inverts [A].

Figure 9A:
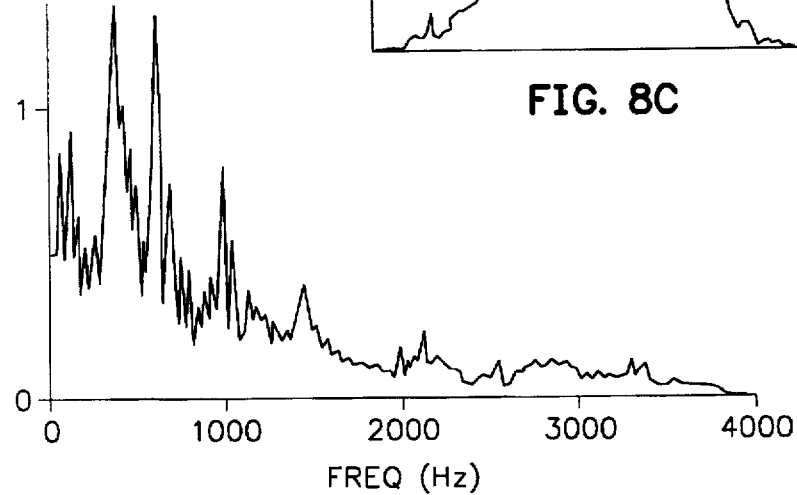
FIGS. 9A and 9B show typical spectra of a speech signal before and after decorrelation is performed according to the procedure of this invention.
Figure 9B:
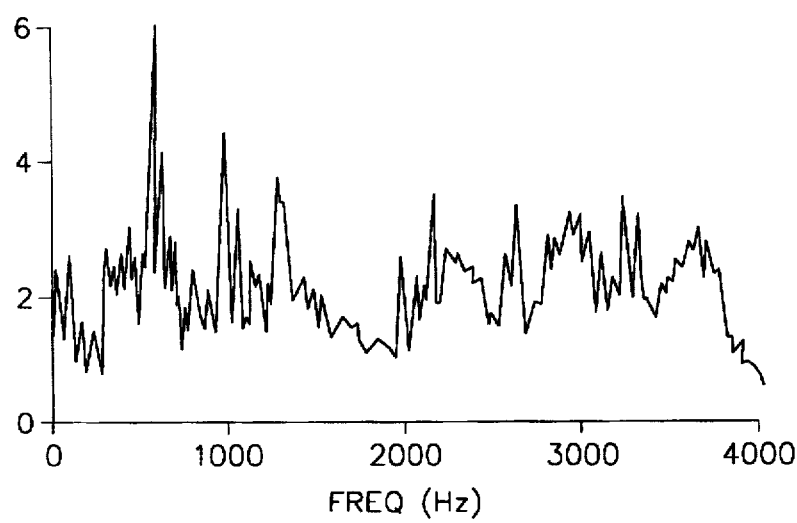

The first whitening example shows what happens when "deconvolving" a speech signal that has not been corrupted (convolving filter [A] is a delta-function). If the tap spacing is close enough, as in this case where the tap spacing is identical to the sample internal, the process of this invention learns the whitening filter shown in FIG. 11C that flattens the amplitude spectrum of the speech up to the Nyquist limit (equivalent to half of the sampling frequency). FIG. 9A shows the spectrum of the speech sequence before deconvolution and FIG. 9B shows the speech spectrum after deconvolution by the filter shown in FIG. 11C. Whitened speech sounds like a clear sharp version of the original signal because the phase structure is preserved. By using all available frequency levels equally, the system is maximizing information throughput in the channel. Thus, when the original signal is not white, the deconvolving filter of this invention will recover a whitened version of it rather than the exact original. However, when the filter taps are spaced further apart, as in FIGS. 11E–11L, there is less opportunity for simple whitening.

In the second "barrel-effect" example shown in FIG. 11E, a 6.25 ms echo is added to the speech signal. This creates a mild audible barrel effect. Because filter 11E is finite in length, its inverse is infinite in length but is shown in FIG. 11F as truncated. The inverting filter learned in FIG. 11G resembles FIG. 11F although the resemblance tails off toward the left side because the process of this invention actually learns an optimal filter of finite length instead of a truncated infinite optimal filter. The resulting deconvolution shown in FIG. 11H is very good.

The best results from the blind deconvolution process of this invention are seen when the ideal deconvolving filter is of finite length, as in the third example shown in FIGS. 11I–11L. FIG. 11I shows a set of exponentially-decaying echoes spread out over 275 ms that may be inverted by a two-point filter shown in FIG. 11J with a small decaying correction on the left, which is an artifact of the truncation of the convolving filter shown in FIG. 11I. As seen in FIG. 11K, the learned filter corresponds almost exactly to the ideal filter in FIG. 11J and the deconvolution in FIG. 11L is almost perfect. This result demonstrates the sensitivity of the blind processing method of this invention in cases where the tap-spacing is great enough (100 sample intervals) that simple whitening cannot interfere noticeably with the deconvolution process.

Clearly, other embodiments and modifications of this invention may occur readily to those of ordinary skill in the art in view of these teachings. Therefore, this invention is to be limited only by the following claims, which include all such embodiments and modifications when viewed in conjunction with the above specification and accompanying drawing.

I claim:

1. A method performed in a neural network having input means for receiving a plurality J of input signals ($X_j$) and output means for producing a plurality I of output signals ($U_i$) each said output signal $U_i$ representing a combination of said input signals ($X_j$) weighted by a plurality I of bias weights ($W_{io}$) and a plurality $I^2$ of scaling weights ($W_{ij}$) such that ($U_i$)=($W_{ij}$)($X_j$)+($W_{io}$), said method minimizing the information redundancy among said output signals ($U_j$), wherein 0<i≦I>1 and 0<j≦J>1 are integers, said method comprising:

(a) selecting initial values for said bias weights ($W_{io}$) and said scaling weights ($W_{ij}$);

(b) producing a plurality I of training signals ($Y_i$) responsive to a transformation of said input signals ($X_j$) such that $Y_i = g(U_i)$, wherein $g(x)$ is a nonlinear function and the Jacobian of said transformation is $J = \det(\partial Y_i/\partial X_j)$ when $J = I$; and (c) adjusting said bias weights ($W_{i0}$) and said scaling weights ($W_{ij}$) responsive to one or more samples of said training signals ($Y_i$) such that each said bias weight $W_{i0}$ is changed proportionately to a corresponding bias measure $\Delta W_{i0}$ accumulated over said one or more samples and each said scaling weight $W_{ij}$ is changed proportionately to a corresponding scaling measure $\Delta W_{ij} = \epsilon \cdot \partial(\ln|J|)/\partial W_{ij}$ accumulated over said one or more samples, wherein $\epsilon > 0$ is a learning rate.

2. The method of claim 1 wherein said nonlinear function $g(x)$ is a nonlinear function selected from a group consisting essentially of the solutions to the equation $$\frac{\partial}{\partial x} g(x) = 1 - |g(x)|^r$$

and said $\Delta W_{i0} = \epsilon \cdot (-rX_j|Y_i|^{r-1}\mathrm{sgn}(Y_i))$ accumulated over said one or more samples and each said scaling weight $W_{ij}$ is changed proportionately to a corresponding scaling measure $\Delta W_{ij} = \epsilon \cdot ((\mathrm{cof}(W_{ij})/\det(W_{ij})) - rX_j|Y_i|^{r-1}\,\mathrm{sgn}(Y_i))$ accumulated over said one or more samples.

3. The method of claim 1 wherein said nonlinear function $g(x)$ is a nonlinear function selected from a group consisting essentially of $g_1(x) = \tanh(x)$ and $g_2(x) = (1-e^{-x})^{-1}$ and said $\Delta W_{i0}$ selected from the group consisting essentially of $\Delta_1 W_{i0} = \epsilon \cdot (-2Y_i)$ and $\Delta_2 W_{i0} = \epsilon \cdot (1-2Y_i)$ accumulated over said one or more samples and each said scaling weight $W_{ij}$ is changed proportionately to the a corresponding scaling measure $\Delta W_{ij}$ selected from the group consisting essentially of $\Delta_1 W_{ij} = \epsilon \cdot ((\mathrm{cof}(W_{ij})/\det(W_{ij})) - 2X_jY_i)$ and $\Delta_2 W_{ij} = \epsilon \cdot ((\mathrm{cof}(W_{ij})/\det(W_{ij})) + X_j(1-2Y_i))$ accumulated over said one or more samples.

4. A neural-network implemented method for recovering one or more of a plurality I of independent source signals ($S_i$) from a plurality $J > I$ of sensor signals ($X_j$) each including a combination of at least some of said source signals ($S_i$) wherein $0 < i \leq I > 1$ and $0 < j \leq J > I$ are integers, said method comprising:

(a) selecting a plurality I of bias weights ($W_{i0}$) and a plurality $I^2$ of scaling weights ($W_{ij}$);

(b) adjusting said bias weights ($W_{i0}$) and said scaling weights ($W_{ij}$) by repeatedly performing the steps of:

(b.1) producing a plurality I of estimation signals ($U_i$) responsive to said sensor signals ($X_j$) such that $(U_i) = (W_{ij})(X_j) + (W_{i0})$, (b.2) producing a plurality I of training signals ($Y_i$) responsive to a transformation of said sensor signals ($X_j$) such that $Y_i = g(U_i)$, wherein $g(x)$ is a nonlinear function and the Jacobian of said transformation is $J = \det(\partial Y_i/\partial X_j)$ when $J = I$, and (b.3) adjusting each said bias weight $W_{i0}$ and each said scaling weight $W_{ij}$ responsive to one or more samples of said training signals ($Y_i$) such that said each bias weight $W_{i0}$ is changed proportionately to a bias measure $\Delta W_{i0}$ accumulated over said one or more samples and said each scaling weight $W_{ij}$ is changed proportionately to a corresponding scaling measure $\Delta W_{ij} = \epsilon \cdot \partial(\ln|J|)/\partial W_{ij}$ accumulated over said one or more samples, wherein $\epsilon > 0$ is a learning rate; and (c) producing said estimation signals ($U_i$) to represent said one or more recovered source signals ($S_i$).

5. The method of claim 4 wherein said nonlinear function $g(x)$ is a nonlinear function selected from a group consisting essentially of the solutions to the equation $$\frac{\partial}{\partial x} g(x) = 1 - |g(x)|^r$$

and said $\Delta W_{i0} = \epsilon \cdot (-rX_j|Y_i|^{r-1}\mathrm{sgn}(Y_i))$ accumulated over said one or more samples and each said scaling weight $W_{ij}$ is changed proportionately to a corresponding scaling measure $\Delta W_{ij} = \epsilon \cdot ((\mathrm{cof}(W_{ij})/\det(W_{ij})) - rX_j|Y_i|^{r-1}\,\mathrm{sgn}(Y_i))$ accumulated over said one or more samples.

6. The method of claim 4 wherein said nonlinear function $g(x)$ is a nonlinear function selected from a group consisting essentially of $g_1(x) = \tanh(x)$ and $g_2(x) = (1-e^{-x})^{-1}$ and said adjusting comprises:

(c) adjusting said bias weights ($W_{i0}$) and said scaling weights ($W_{ij}$) responsive to one or more samples of said training signals ($Y_i$) such that each said bias weight $W_{i0}$ is changed proportionately to a corresponding bias measure $\Delta W_{i0}$ selected from the group consisting essentially of $\Delta_1 W_{i0} = \epsilon \cdot (-2Y_i)$ and $\Delta_2 W_{i0} = \epsilon \cdot (1-2Y_i)$ accumulated over said one or more samples and each said scaling weight $W_{ij}$ is changed proportionately to the a corresponding scaling measure $\Delta W_{ij}$ selected from the group consisting essentially of $\Delta_1 W_{ij} = \Delta \cdot ((\mathrm{cof}(W_{ij})/\det(W_{ij})) - 2X_jY_i)$ and $\Delta_2 W_{ij} = \epsilon \cdot ((\mathrm{cof}(W_{ij})/\det(W_{ij})) + X_j(1-2Y_i))$ accumulated over said one or more samples.

7. A method implemented in a transversal filter having an input for receiving a sensor signal X that includes a combination of multipath reverberations of a source signal S and having a plurality I of delay line tap output signals ($T_i$) distributed at intervals of one or more time delays $\tau$, said source signal S and said sensor signal X varying with time over a plurality $J \geq I$ of said time delay intervals $\tau$ such that said sensor signal X has a value $X_j$ at time $\tau(j-1)$ and each said delay line tap output signal $T_i$ has a value $X_{j+1-i}$ representing said sensor signal value $X_j$ delayed by a time interval $\tau(i-1)$, wherein $\tau > 0$ is a predetermined constant and $0 < i \leq I > 1$ and $0 < j \leq J \geq I$ are integers, said method recovering said source signal S from said sensor signal X and comprising:

(a) selecting a plurality I of filter weights ($W_i$);

(b) adjusting said filter weights ($W_i$) by repeatedly performing the steps of (b.1) producing a plurality $K = I$ of weighted tap output signals ($V_k$) by combining said delay line tap output signals ($T_i$) such that $(V_k) = (F_{ki})\,(T_i)$, wherein $0 < k \leq K = I > 1$ are integers, and wherein $F_{ki} = W_{k+1-i}$ when $1 \leq k+1-i \leq I$ and $F_{ki} = 0$ otherwise, (b.2) summing a plurality $K = I$ of said weighted tap signals ($V_k$) to produce an estimation signal $$U = \sum_{k=1}^{K} V_k,$$

wherein said estimation signal U has a value $U_j$ at time $\tau(j-1)$, (b.3) producing a plurality J of training signals ($Y_j$) responsive to a transformation of said sensor signal values ($X_j$) such that $Y_j = g(U_j)$ wherein $g(x)$ is a nonlinear function and the Jacobian of said transformation is $J = \det(\partial Y_i/\partial X_j)$ when $J = I$, and (b.4) adjusting each said filter weight $W_i$ responsive to one or more samples of said training signals ($Y_j$) such that said each filter weight $W_i$ is changed proportionately to a corresponding leading measure $\Delta W_i$ accumulated over said one or more samples when i=1 and a corresponding scaling measure $\Delta W_i = \epsilon \cdot \partial(\ln|J|)/\partial W_i$ accumulated over said one or more samples otherwise; and (c) producing said estimation signal U to represent said recovered source signal S.

8. The method of claim 7 wherein said nonlinear function g(x) is a nonlinear function selected from a group consisting essentially of $g_1(x)=\tanh(x)$ and $g_2(X)=(1-e^{-x})^{-1}$ and said $\Delta W_1$ selected from the group consisting essentially of $$\Delta_1 W_1 = \epsilon \cdot \sum_{j=1}^{J} \left( \frac{1}{W_1} - 2X_j Y_j \right) \text{ and } \Delta_2 W_1 =$$

$$\epsilon \cdot \sum_{j=1}^{J} \left( \frac{1}{W_1} + X_j(1 - 2Y_j) \right)$$

accumulated over said one or more samples when i=1 and a corresponding scaling measure $\Delta W_i$ selected from the group consisting essentially of $$\Delta_1 W_i = \epsilon \cdot \sum_{j=i-1}^{J} (-2X_{i+j-1}Y_j) \text{ and } \Delta_2 W_i = \epsilon \cdot \sum_{j=i-1}^{J} X_{i+j-1}(1 - 2Y_j)$$

accumulated over said one or more samples otherwise.

9. The method of claim 7 wherein said nonlinear function g(x) is a nonlinear function selected from a group consisting essentially of the solutions to the equation $$\frac{\partial}{\partial x} g(x) = 1 - |g(x)|^r \text{ and said } \Delta W_1 =$$

$$\epsilon \cdot \sum_{j=1}^{J} \left( \frac{1}{W_1} - rX_j|Y_j|^{r-1}\text{sgn}(Y_i) \right)$$

accumulated over said one or more samples when i=1 and a corresponding scaling measure $$\Delta W_i = \epsilon \cdot \sum_{j=i-1}^{J} (-rX_{i+j-1}|Y_j|^{r-1}\text{sgn}(Y_i))$$

accumulated over said one or more samples otherwise.

10. A neural network for recovering a plurality of source signals from a plurality of mixtures of said source signals, said neural network comprising:

input means for receiving a plurality J of input signals ($X_j$) each including a combination of at least some of a plurality I of independent source signals ($S_i$), wherein $0 < i \leq I > 1$ and $0 < j \leq J \geq I$ are integers;

weight means coupled to said input means for storing a plurality I of bias weights ($W_{i0}$) and a plurality $I^2$ of scaling weights ($W_{ij}$);

output means coupled to said weight means for producing a plurality I of output signals ($U_i$) responsive to said input signals ($X_j$) such that $(U_i)=(W_{ij})(X_j)+(W_{i0})$;

training means coupled to said output means for producing a plurality I of training signals ($Y_i$) responsive to a transformation of said input signals ($X_j$) such that $Y_i = g(U_i)$, wherein g(x) is a nonlinear function and the Jacobian of said transformation is $J=\det(\partial Y_i/\partial X_j)$ when J=I;

adjusting means coupled to said training means and said weight means for adjusting said bias weights ($W_{i0}$) and said scaling weights ($W_{ij}$) responsive to one or more samples of said training signals ($Y_i$) such that each said bias weight $W_{i0}$ is changed proportionately to a corresponding bias measure $\Delta W_{i0}$ accumulated over said one or more samples and each said scaling weight $W_{ij}$ is changed proportionately to a corresponding scaling measure $\Delta W_{ij} = \epsilon \cdot \partial(\ln|J|)/\partial W_{ij}$ accumulated over said one or more samples, wherein $\epsilon > 0$ is a learning rate.

11. The neural network of claim 10 wherein said nonlinear function g(x) is a nonlinear function selected from a group consisting essentially of the solutions to the equation $$\frac{\partial}{\partial x} g(x) = 1 - |g(x)|^r$$

and said bias measure $\Delta W_{i0}=\epsilon \cdot (-r|Y_i|^{r-1}\text{sgn}(Y_i))$ and said scaling measure $\Delta W_{ij}=\epsilon \cdot ((\text{cof}(W_{ij})/\det(W_{ij}))-rX_j|Y_i|^{r-1}\text{sgn}(Y_i))$.

12. The neural network of claim 10 wherein said nonlinear function g(x) is a nonlinear function selected from a group consisting essentially of $g_1(x)=\tanh(x)$ and $g_2(x)=(1-e^{-x})^{-1}$ and said bias measure $\Delta W_{i0}$ is selected from a group consisting essentially of $\Delta_1 W_{i0} = -2Y_i$ and $\Delta_2 W_{i0} = 1-2Y_i$ and said scaling measure $\Delta W_{ij}$ is selected from a group consisting essentially of $\Delta_1 W_{ij} = (\text{cof}(W_{ij})/\det(W_{ij}))-X_j 2Y_i$ and $\Delta_2 W_{ij} = (\text{cof}(W_{ij})/\det(W_{ij}))+X_j(1-2Y_i)$.

13. A system for adaptively cancelling one or more interferer signals ($S_n$) comprising:

input means for receiving a plurality J of input signals ($X_j$) each including a combination of at least some of a plurality I of independent source signals ($S_i$) that includes said one or more interferer signals ($S_n$), wherein $0 < i \leq I > 1$, $0 < j \leq J \geq I$ and $0 < n \leq N \geq 1$ are integers;

weight means coupled to said input means for storing a plurality I of bias weights ($W_{i0}$) and a plurality $I^2$ of scaling weights ($W_{ij}$);

output means coupled to said weight means for producing a plurality I of output signals ($U_i$) responsive to said input signals ($X_j$) such that $(U_i)=(W_{ij})(X_j)+(W_{i0})$;

training means coupled to said output means for producing a plurality I of training signals ($Y_i$) responsive to a transformation of said input signals ($X_j$) such that $Y_i = g(U_i)$, wherein g(x) is a nonlinear function and the Jacobian of said transformation is $J=\det(\partial Y_i/\partial X_j)$;

adjusting means coupled to said training means and said weight means for adjusting said bias weights ($W_{i0}$) and said scaling weights ($W_{ij}$) responsive to one or more samples of said training signals ($Y_i$) such that each said bias weight $W_{i0}$ is changed proportionately to a corresponding bias measure $\Delta W_{i0}$ accumulated over said one or more samples and each said scaling weight $W_{ij}$ is changed proportionately to a corresponding scaling measure $\Delta W_{ij} = \epsilon \cdot \partial(\ln|J|)/\partial W_{ij}$ accumulated over said one or more samples, wherein $\epsilon > 0$ is a learning rate; and feedback means coupled to said output means and said input means for selecting one or more said output signals ($U_n$) representing said one or more interferer signals ($S_n$) for combination with said input signals ($X_j$), thereby cancelling said interferer signals ($S_n$).

14. The system of claim 13 wherein said nonlinear function g(x) is a nonlinear function selected from a group consisting essentially of the solutions to the equation $$\frac{\partial}{\partial x} g(x) = 1 - |g(x)|^r$$

and said bias measure $\Delta W_{i0}=\epsilon \cdot (-r|Y_i|^{r-1}\text{sgn}(Y_i))$ and said scaling measure $\Delta W_{ij}=\epsilon \cdot ((\text{cof}(W_{ij})/\det(W_{ij}))-rX_j|Y_i|^{r-1}\text{sgn}(Y_i))$.

15. The system of claim 13 wherein said nonlinear function g(x) is a nonlinear function selected from a group consisting essentially of $g_1(x)=\tanh(x)$ and $g_2(x)=(1-e^{-x})^{-1}$ and said bias measure $\Delta W_{i0}$ is selected from a group consisting essentially of $\Delta_1 W_{i0}=-2Y_i$ and $\Delta_2 W_{i0}=1-2Y_i$ and said scaling measure $\Delta W_{ij}$ is selected from a group consisting essentially of $\Delta_1 W_{ij}=(\text{cof}(W_{ij})/\text{det}(W_{ij}))-X_j 2Y_i$ and $\Delta_2 W_{ij}=(\text{cof}(W_{ij})/\text{det}(W_{ij}))+X_j(1-2Y_i)$.

* * * * *